United States Patent [19]
Takeuchi et al.

[11] Patent Number: 5,844,841
[45] Date of Patent: Dec. 1, 1998

[54] MEMORY SYSTEM

[75] Inventors: Ken Takeuchi, Tokyo; Tomoharu Tanaka, Yokohama, both of Japan

[73] Assignee: Kabushiki Kaisha Toshiba, Kawasaki, Japan

[21] Appl. No.: 844,724

[22] Filed: Apr. 18, 1997

[30] Foreign Application Priority Data

Apr. 19, 1996 [JP] Japan .................................. 8-098628

[51] Int. Cl.$^6$ .................................................. G11C 16/00
[52] U.S. Cl. ................ 365/185.03; 365/168; 365/185.22
[58] Field of Search ......................... 365/185.03, 185.22, 365/200, 168, 185.24

[56] References Cited

U.S. PATENT DOCUMENTS

| | | | |
|---|---|---|---|
| 4,357,685 | 11/1982 | Daniele et al. | 365/185.22 |
| 4,718,041 | 1/1988 | Baglee et al. | 365/185.22 |
| 4,811,294 | 3/1989 | Kobayashi et al. | 365/185.22 |
| 4,937,787 | 6/1990 | Kobatake | 365/185.22 |
| 4,943,962 | 7/1990 | Imamiya et al. | 365/230.08 |
| 4,958,317 | 9/1990 | Terado et al. | 365/104 |
| 5,105,384 | 4/1992 | Noguchi et al. | 365/185 |
| 5,124,945 | 6/1992 | Schreck | 365/185.22 |
| 5,200,920 | 4/1993 | Norman et al. | 365/185.19 |
| 5,218,569 | 6/1993 | Banks | 365/185.22 |
| 5,247,480 | 9/1993 | Itoh et al. | 365/189.09 |
| 5,257,225 | 10/1993 | Lee | 365/185.19 |
| 5,258,949 | 11/1993 | Chang et al. | 365/185.22 |
| 5,293,350 | 3/1994 | Kim et al. | 365/238.5 |
| 5,299,162 | 3/1994 | Kim et al. | 365/185.22 |
| 5,321,699 | 6/1994 | Endoh et al. | 365/185.22 |
| 5,357,462 | 10/1994 | Tanaka et al. | 365/185.22 |
| 5,361,277 | 11/1994 | Tanaka et al. | 365/189.01 |
| 5,369,615 | 11/1994 | Harari et al. | 365/185.19 |
| 5,379,256 | 1/1995 | Tanaka et al. | 365/185.22 |
| 5,388,084 | 2/1995 | Itoh et al. | 365/185.23 |
| 5,414,658 | 5/1995 | Challa | 365/185 |
| 5,428,569 | 6/1995 | Kato et al. | 365/185.22 |
| 5,440,505 | 8/1995 | Fazio et al. | 365/185.22 |
| 5,452,249 | 9/1995 | Miyamoto et al. | 365/185 |
| 5,463,586 | 10/1995 | Chao et al. | 365/185.22 |
| 5,467,309 | 11/1995 | Tanaka et al. | 365/185.14 |
| 5,487,033 | 1/1996 | Keeney et al. | 365/185.19 |
| 5,555,204 | 9/1996 | Endoh et al. | 365/189.01 |
| 5,557,568 | 9/1996 | Miyamoto et al. | 365/185.22 |
| 5,568,439 | 10/1996 | Harari | 365/185.03 |
| 5,568,626 | 10/1996 | Takizawa | 345/430 |
| 5,570,315 | 10/1996 | Tanaka et al. | 365/185.03 |
| 5,574,879 | 11/1996 | Wells et al. | 365/185.03 |

FOREIGN PATENT DOCUMENTS

| | | |
|---|---|---|
| 0 642 133 | 3/1995 | European Pat. Off. . |
| 7-249294 | 9/1995 | Japan . |
| 2 264 578 | 9/1993 | United Kingdom . |

OTHER PUBLICATIONS

Tomoharu Tanaka et al., "A Quick Intelligent Program Architecture for 3V–only NAND–EEPROMs", 1992 Symposium on VLSI Circuits Digest of Technical Papers, Jun. 4–6, 1992, pp. 20 and 21.

*Primary Examiner*—Tan T. Nguyen
*Attorney, Agent, or Firm*—Banner & Witcoff

[57] ABSTRACT

A memory system according to the present invention includes a memory portion including a memory cell for storing n-level data (n is an integer equal to or larger than 3, for example, 4) data, wherein the memory cell is operated as an n-level data storing memory cell when the number of times of write-erase sequence is smaller than a predetermined number of times, and the memory cell is operated as an m-level (m is an integer smaller than n, for example, 3) data storing memory cell when the number of times of write-erase sequence has exceeded the predetermined number of times. The number of information items (values) which can be stored in one memory cell is decreased with respect to a predetermined number of times of write-erase sequence. Thus, a memory system including a multi-level data storing memory cell and exhibiting improved durability against write-erase sequence operations is provided.

25 Claims, 26 Drawing Sheets

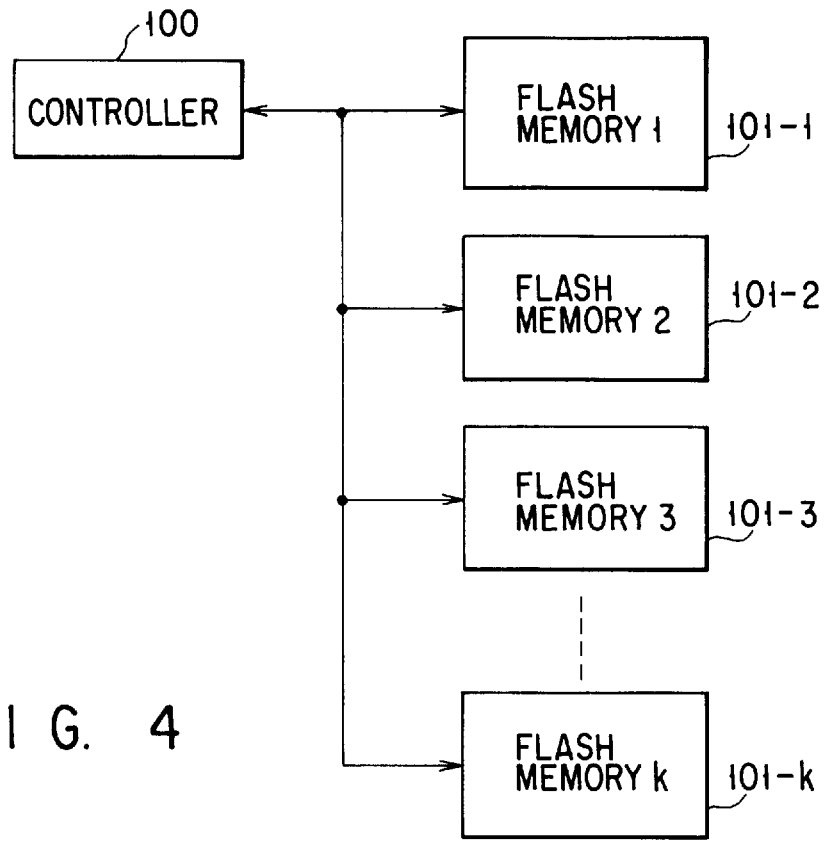
F I G. 4
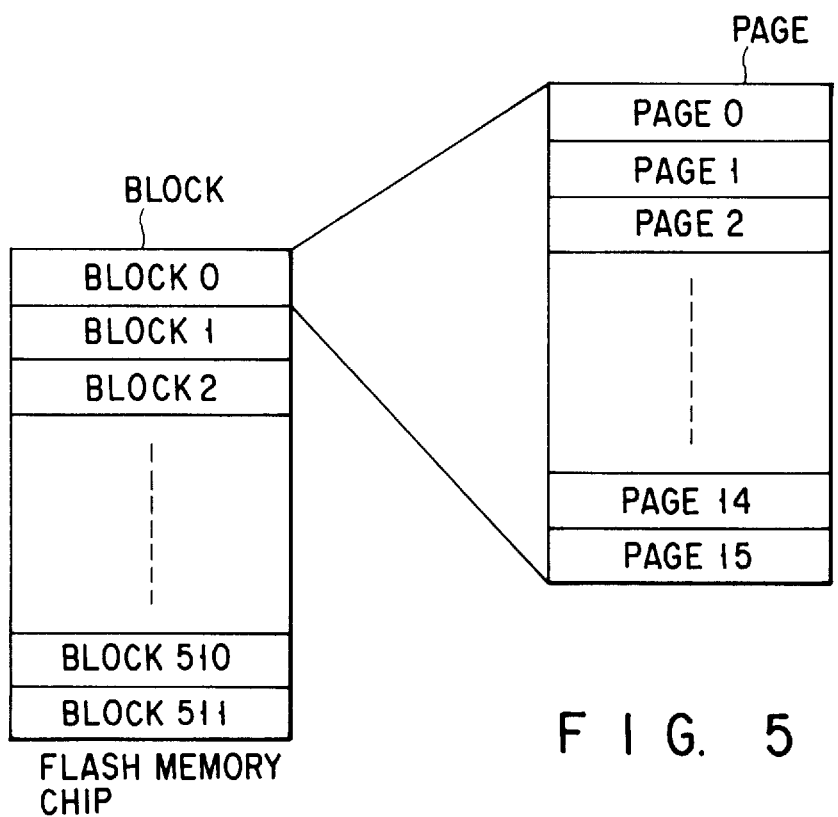
F I G. 5

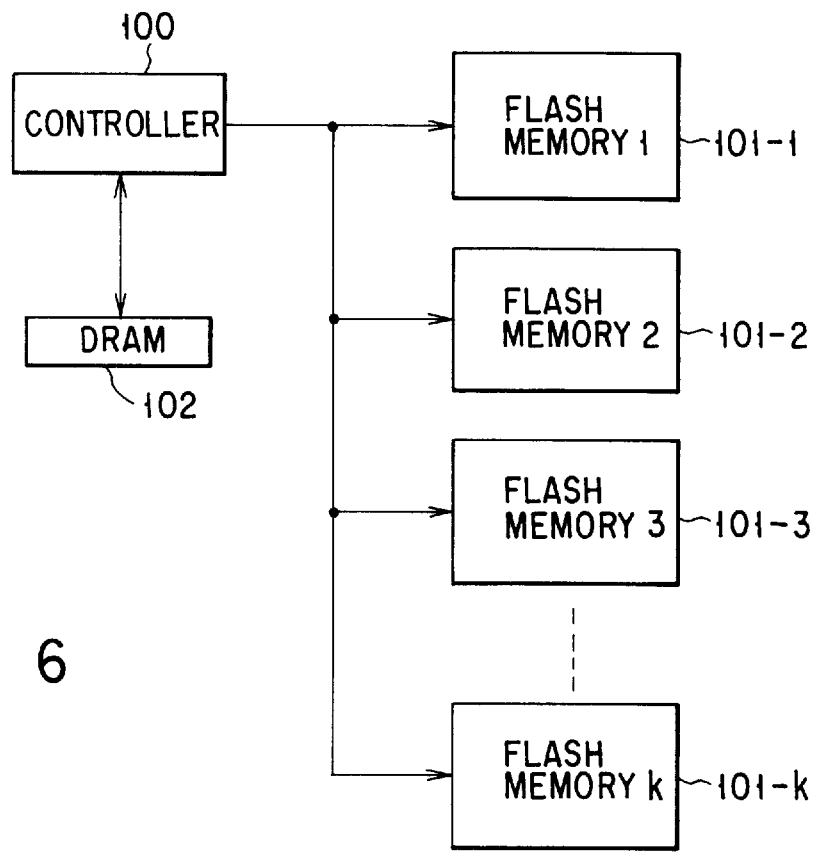
F I G. 6
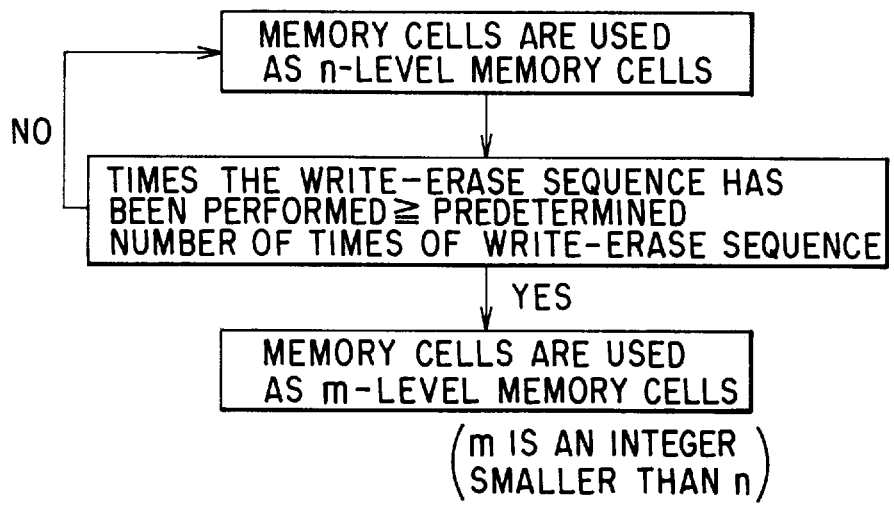
F I G. 7

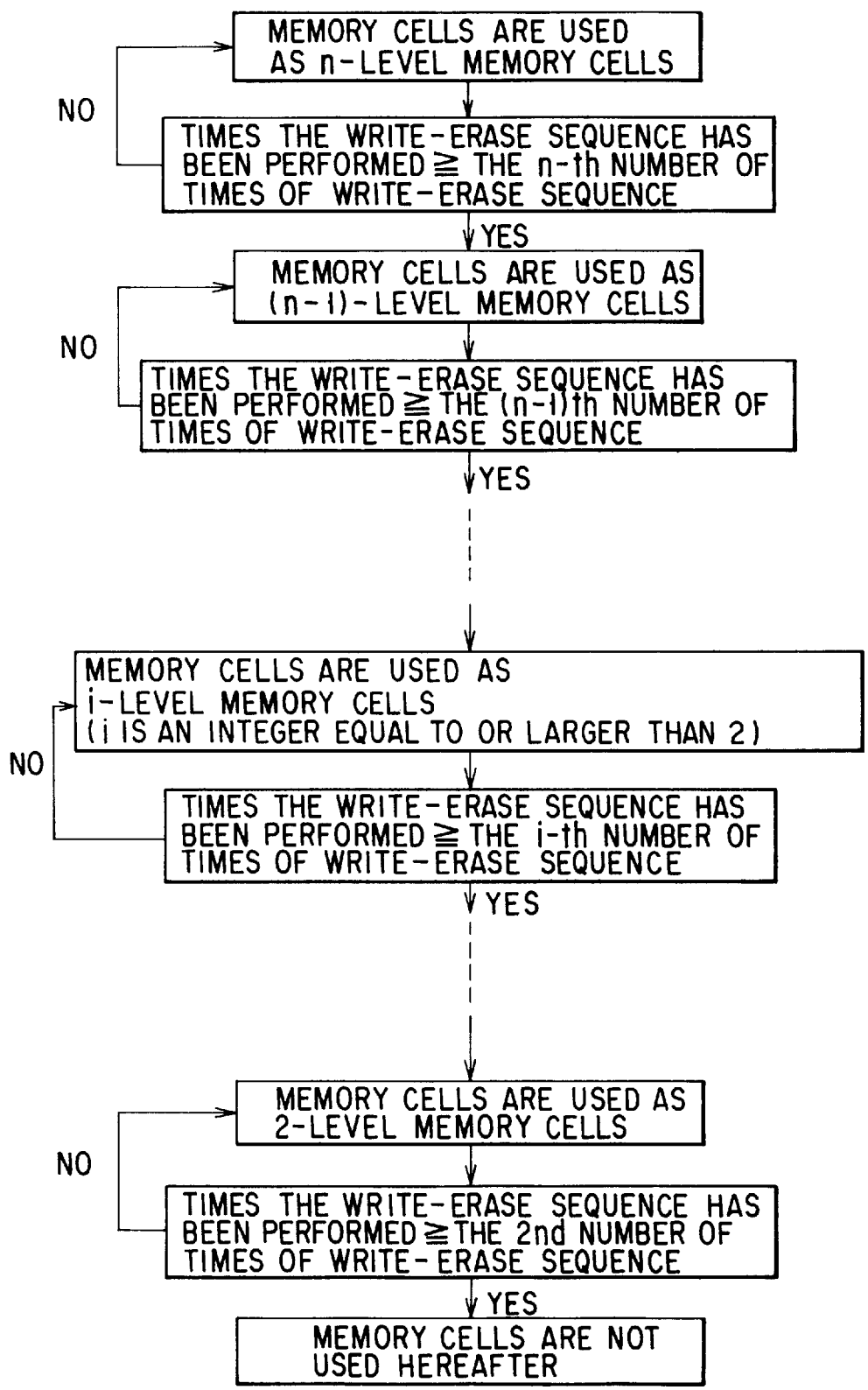
F I G. 12

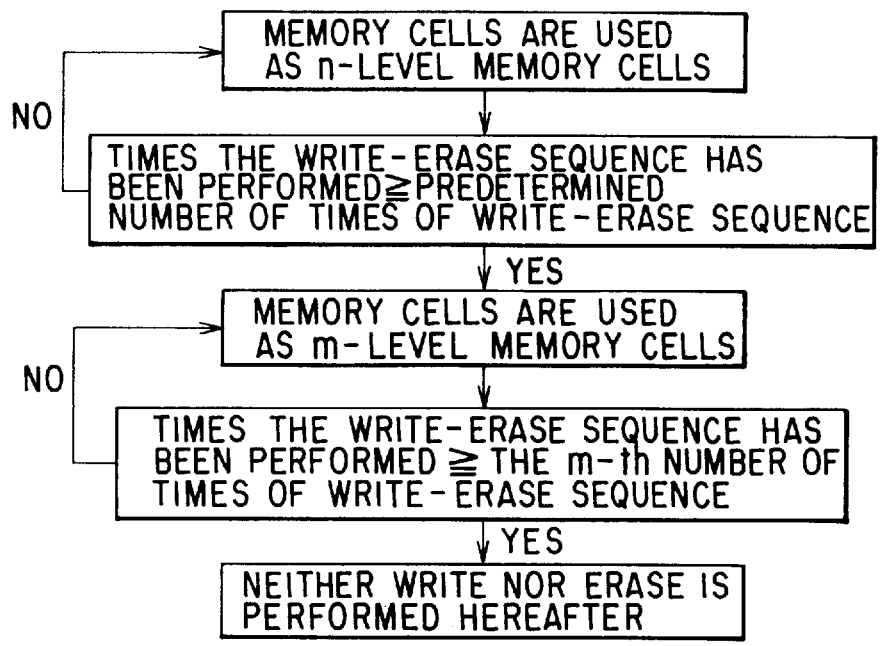
F I G. 13
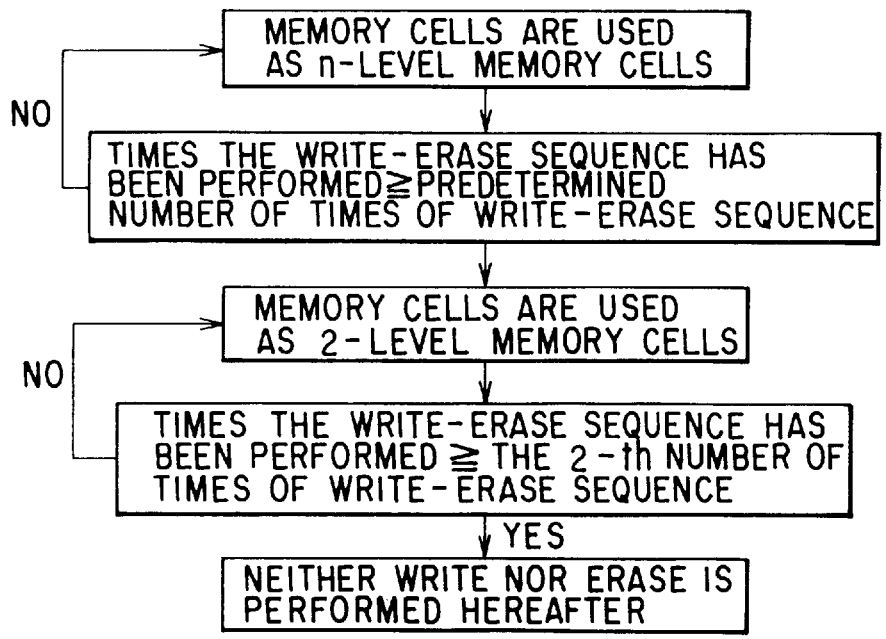
F I G. 14

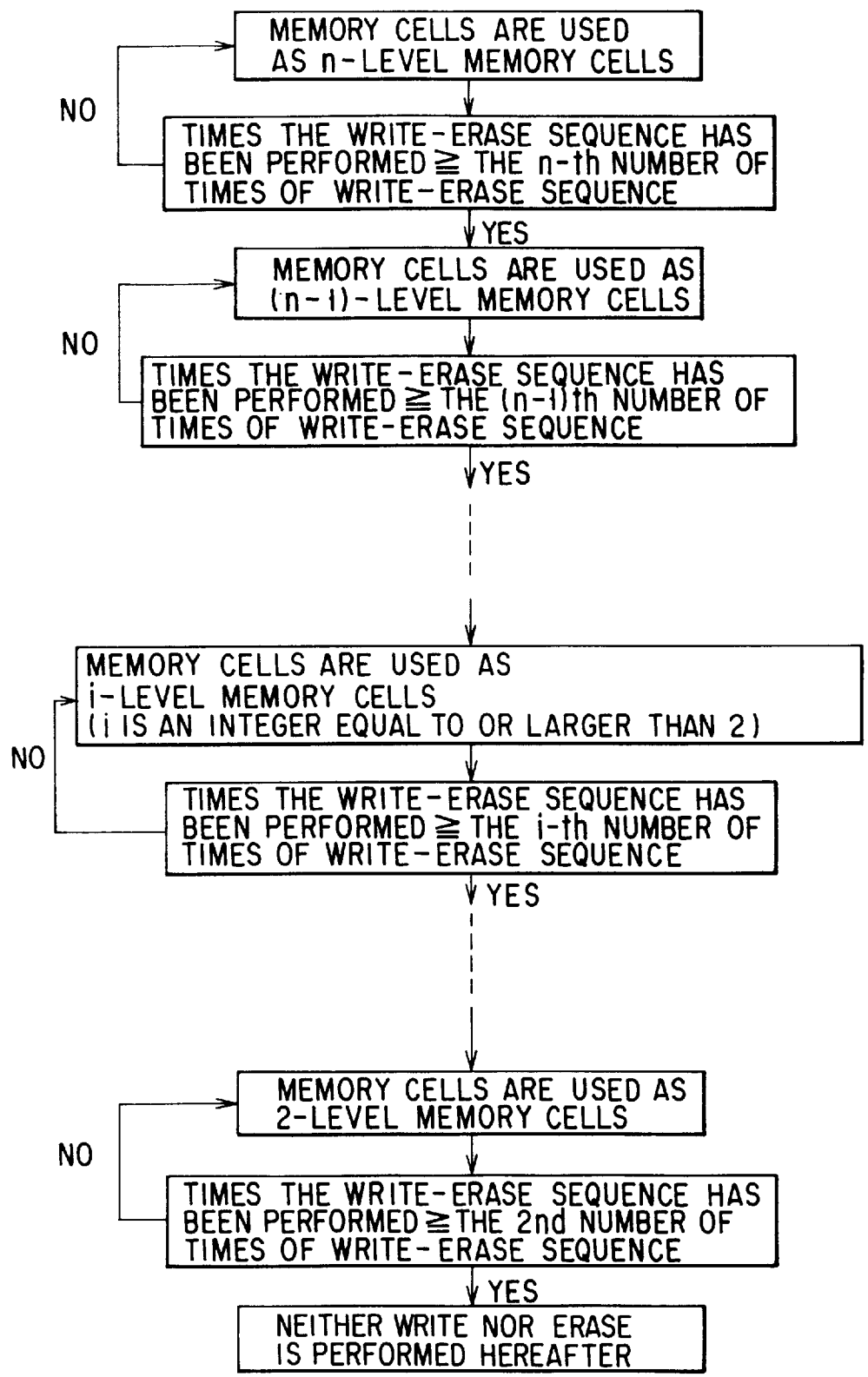
F I G. 15

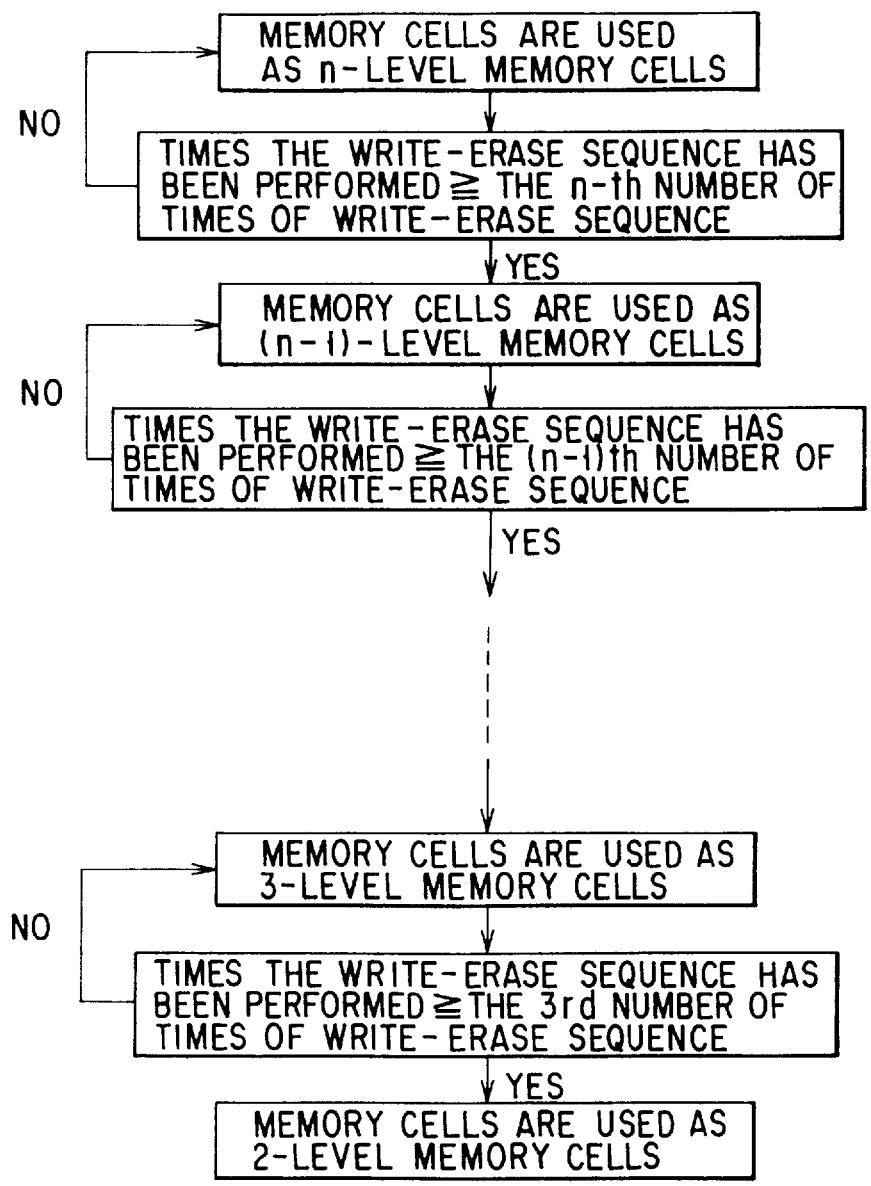
F I G. 16

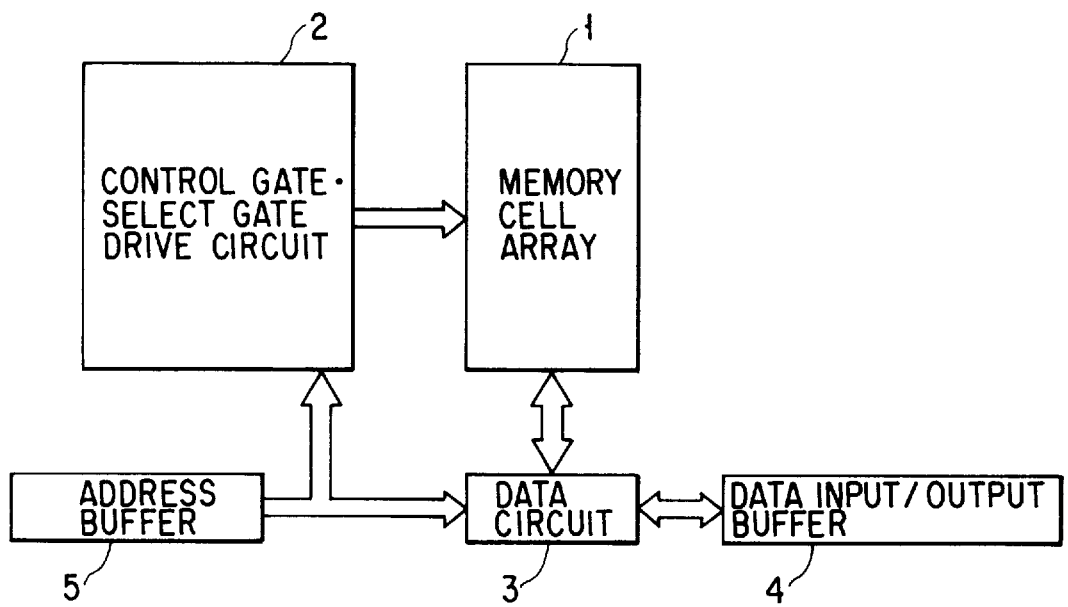
F I G. 17
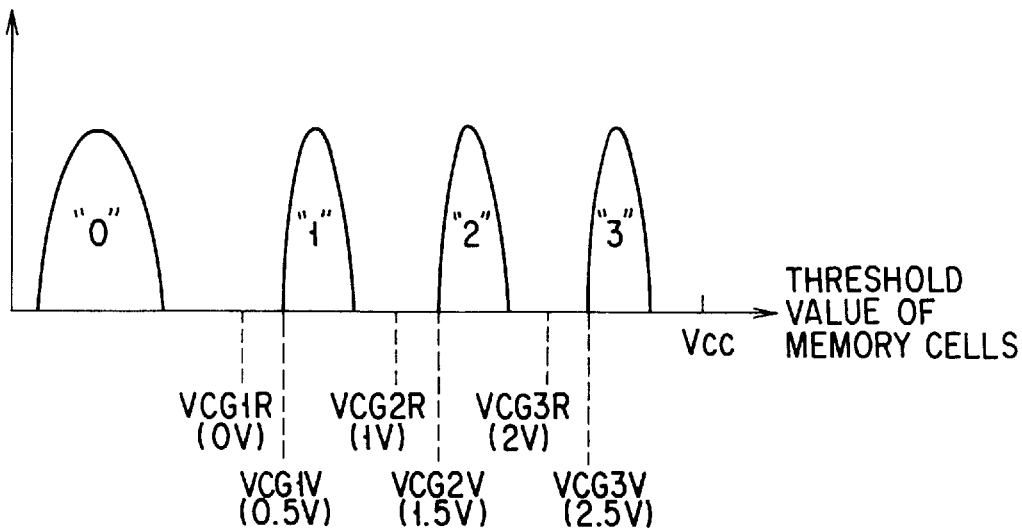
F I G. 19

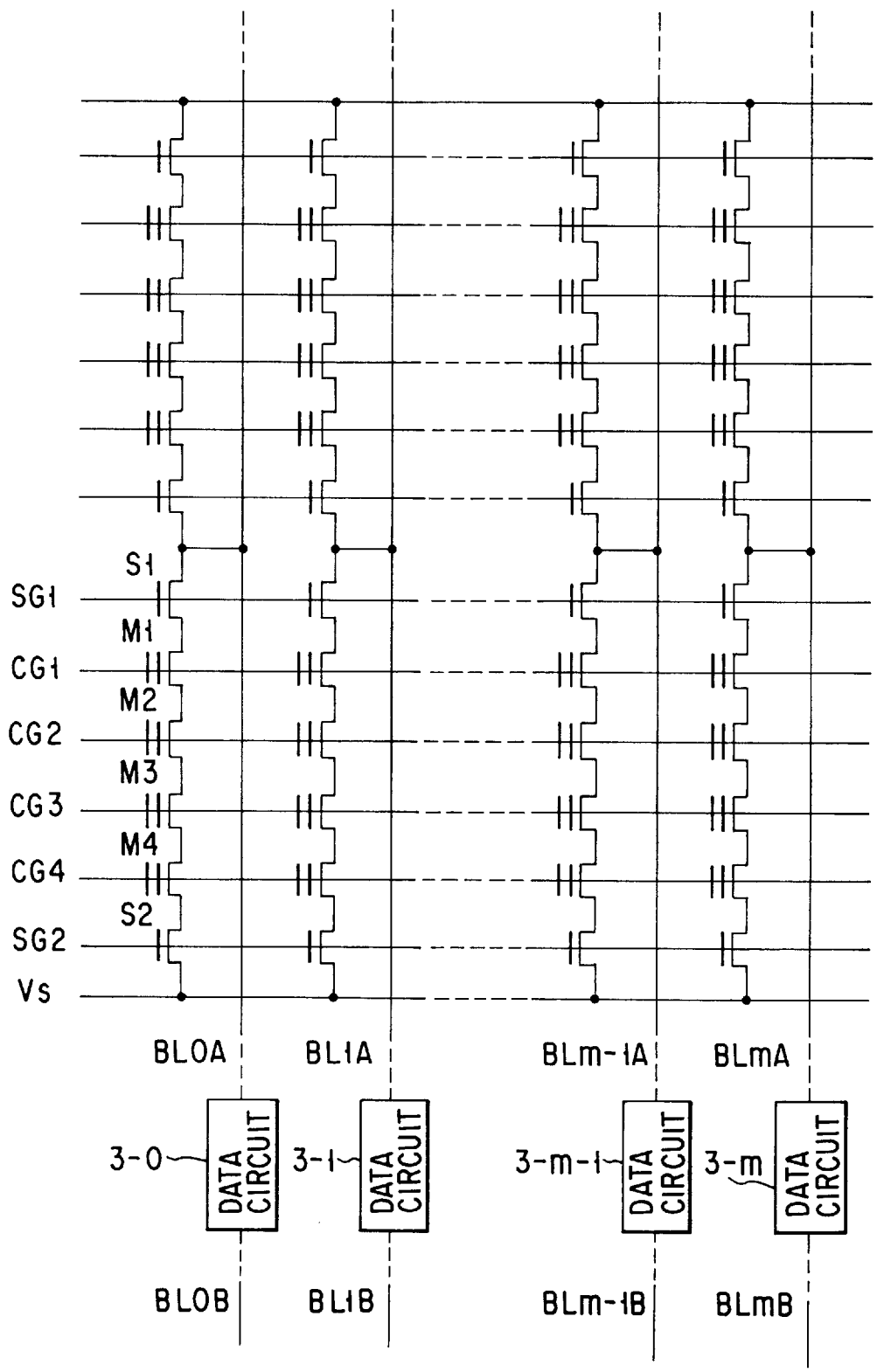
F I G. 18

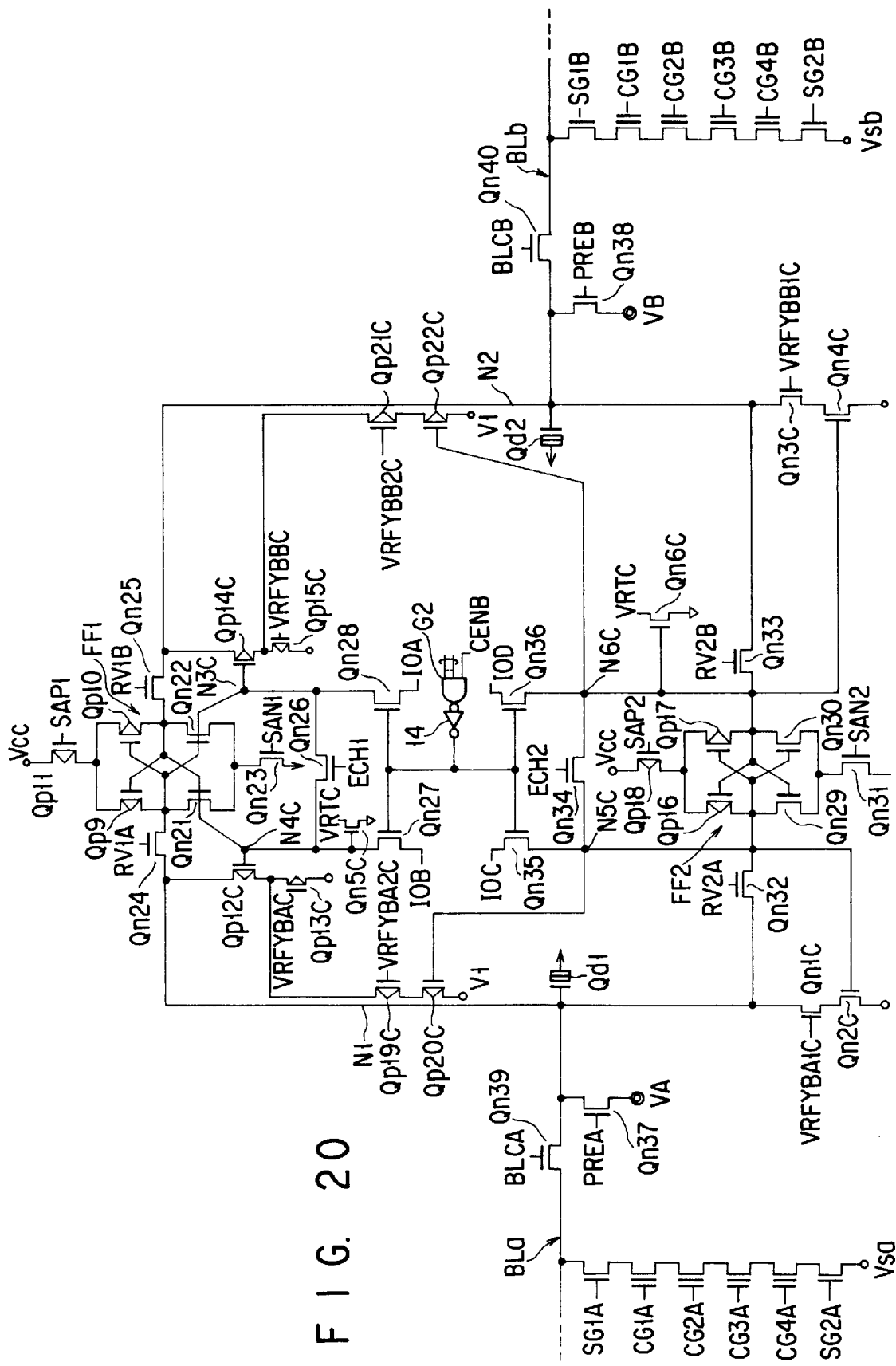
F I G. 20

FIG. 22

|     | "0" | "1" | "2" | "3" |
|-----|-----|-----|-----|-----|
| N3C | L   | H   | H   | H   |
| N5C | L   | L   | H   | H   |

LEVELS OF NODES OF FF1, FF2
AT TIME t7RC IN READ MODE

FIG. 23

|          | "0" | "1" | "2" | "3" |
|----------|-----|-----|-----|-----|
| 10A (N3C)| L   | H   | L   | H   |
| 10B (N4C)| H   | L   | H   | L   |
| 10C (N5C)| L   | L   | H   | H   |
| 10D (N6C)| H   | H   | L   | L   |

READ DATA

FIG. 24

|          | "0" | "1" | "2" | "3" |
|----------|-----|-----|-----|-----|
| 10A (N3C)| H   | H   | L   | L   |
| 10B (N4C)| L   | L   | H   | H   |
| 10C (N5C)| H   | L   | H   | L   |
| 10D (N6C)| L   | H   | L   | H   |

WRITE DATA

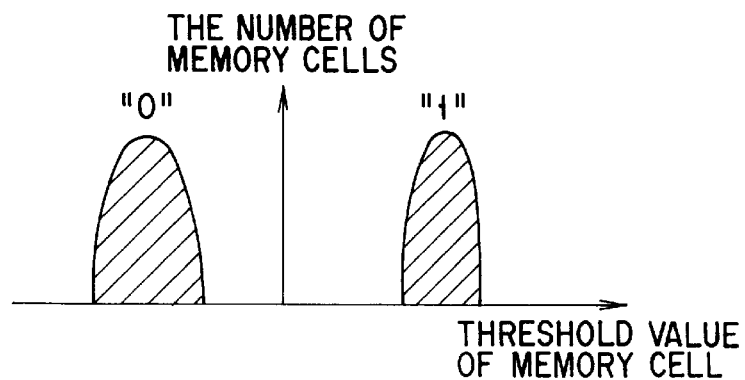
FIG. 28
FIG. 29
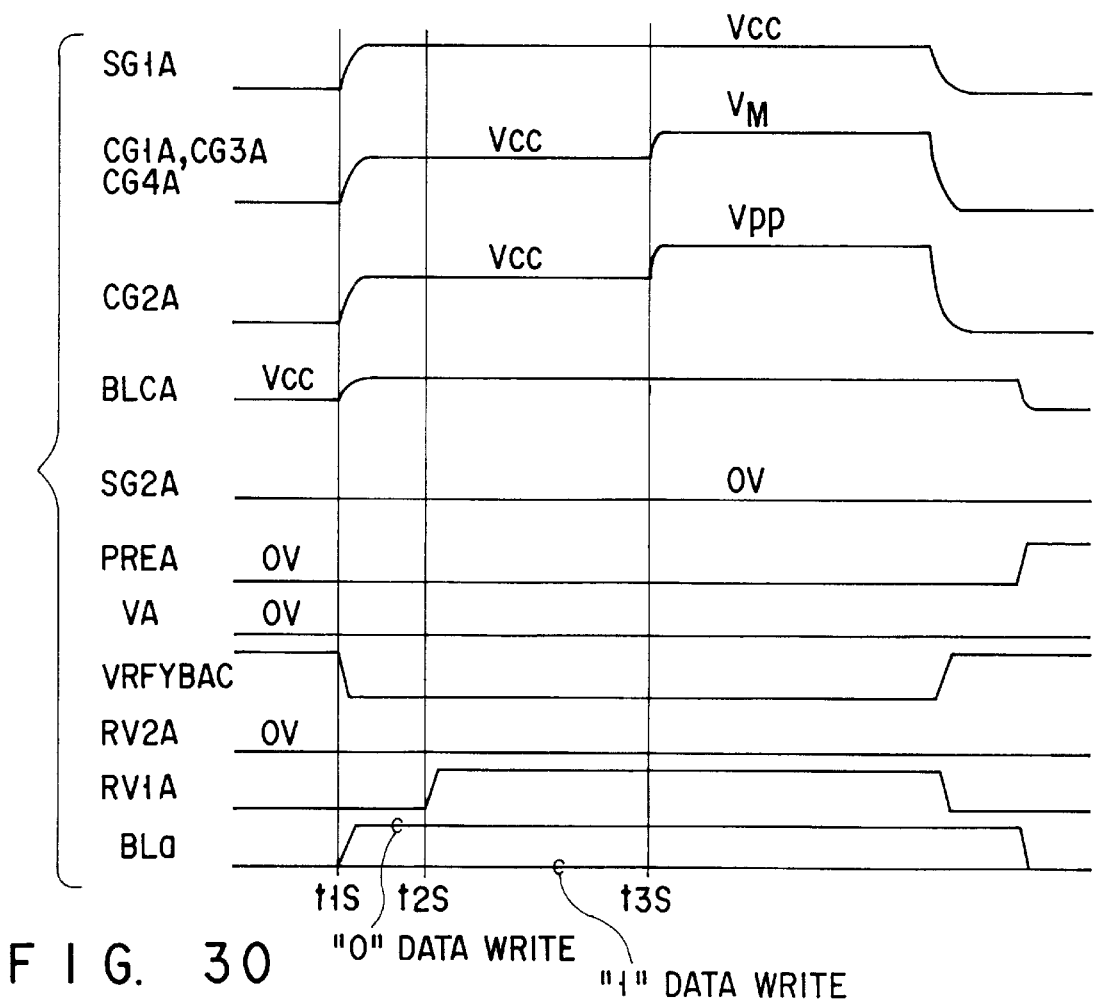
FIG. 30

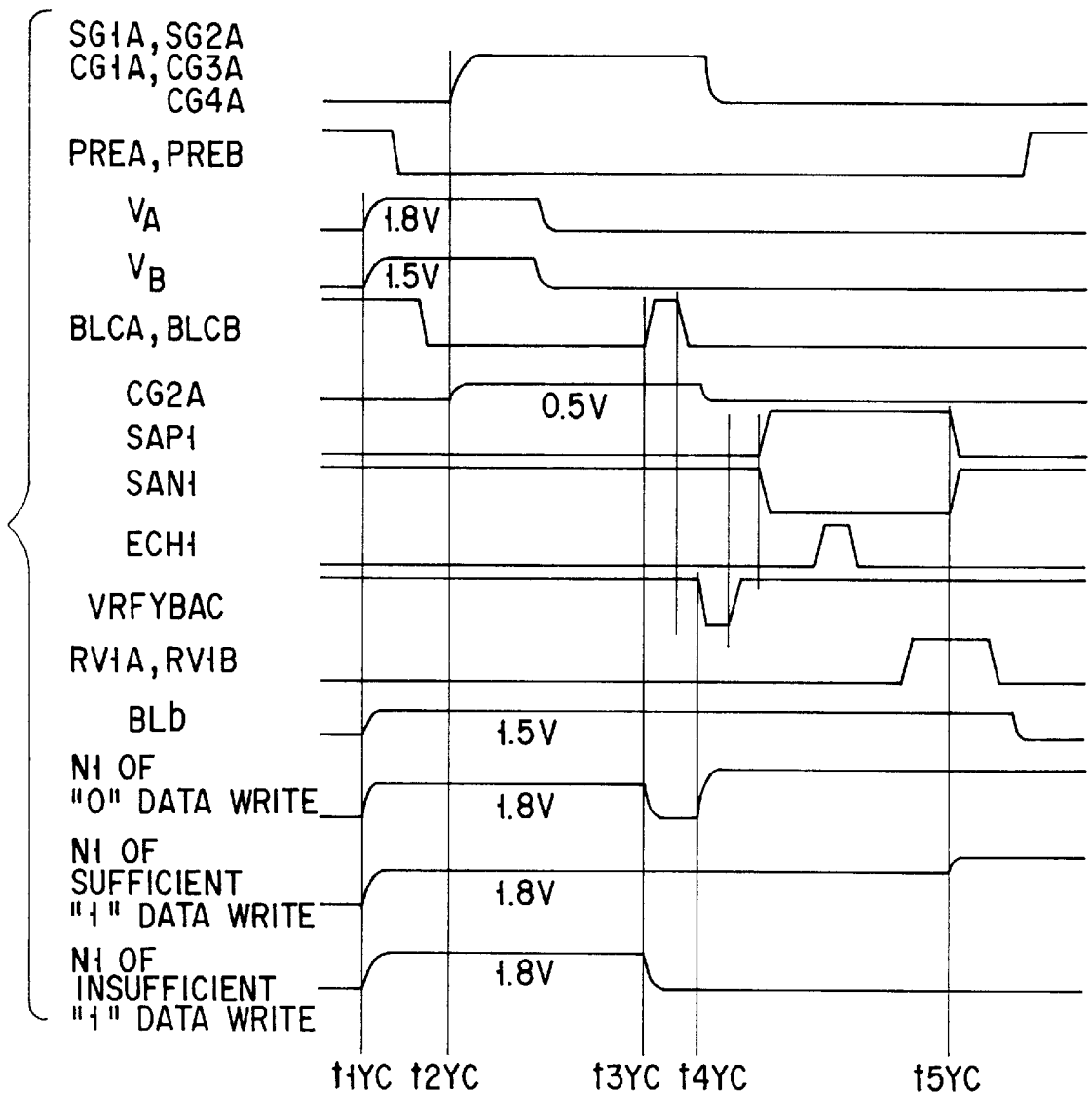
F I G. 31

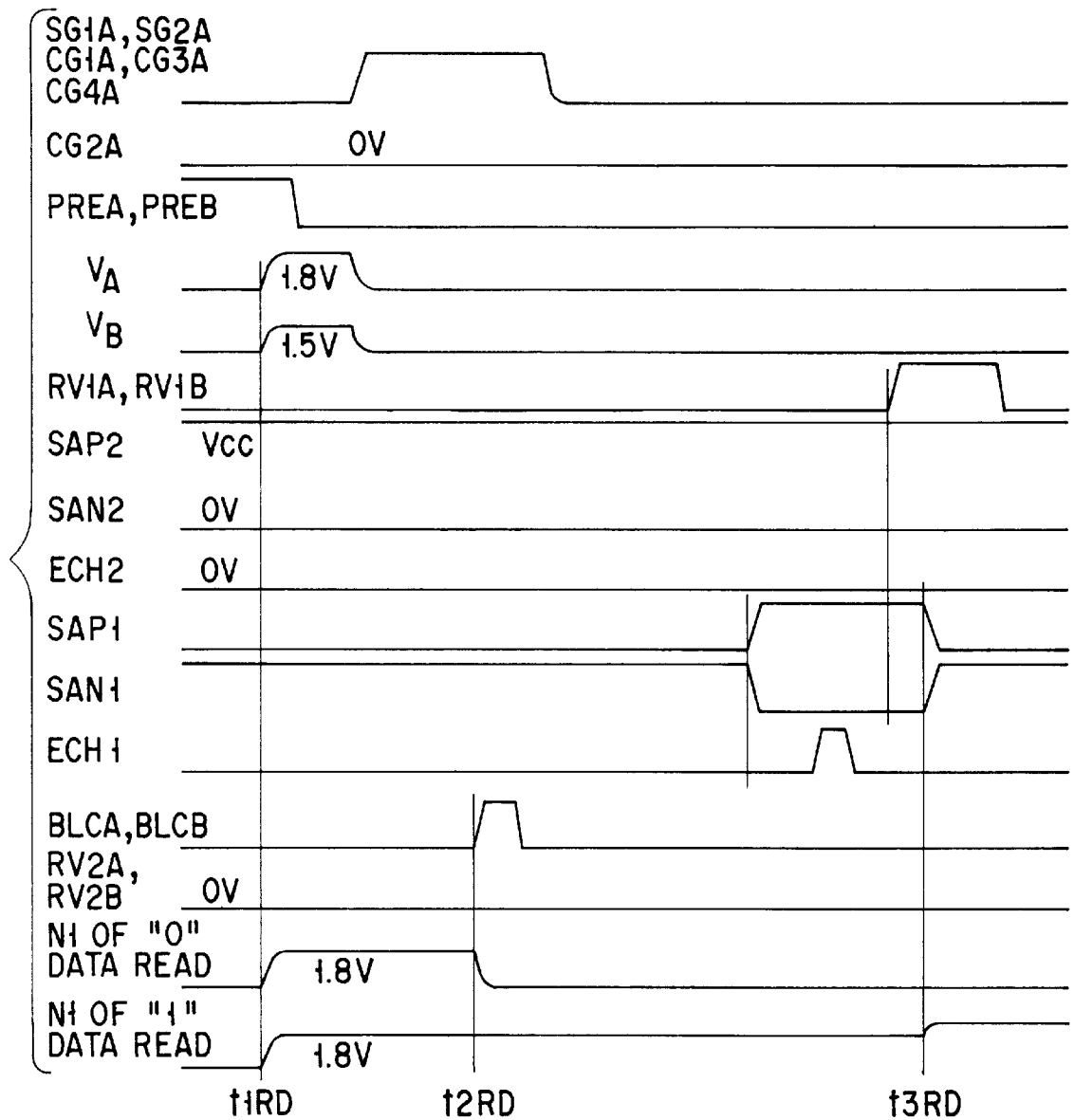
F I G. 32

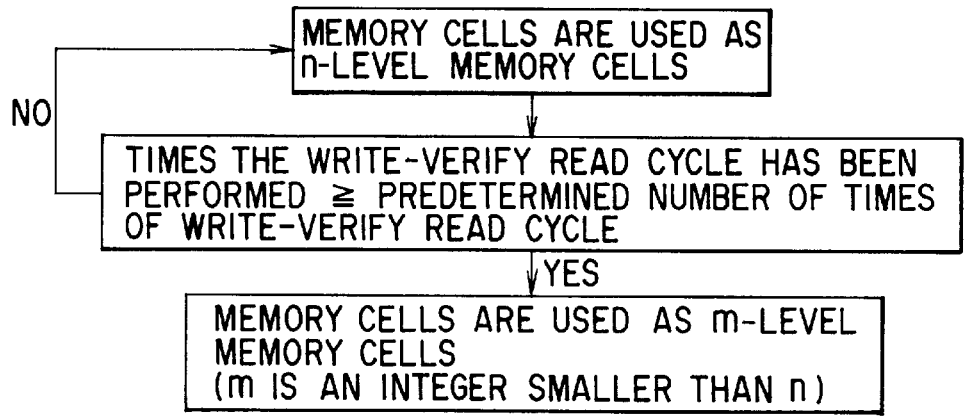
F I G. 33
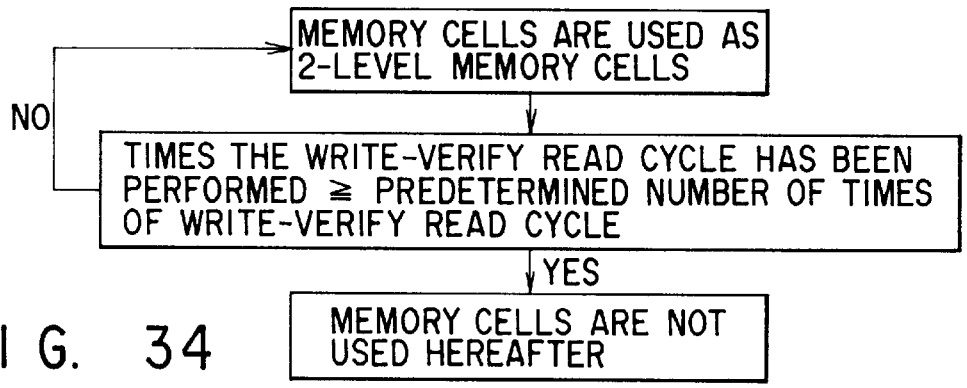
F I G. 34
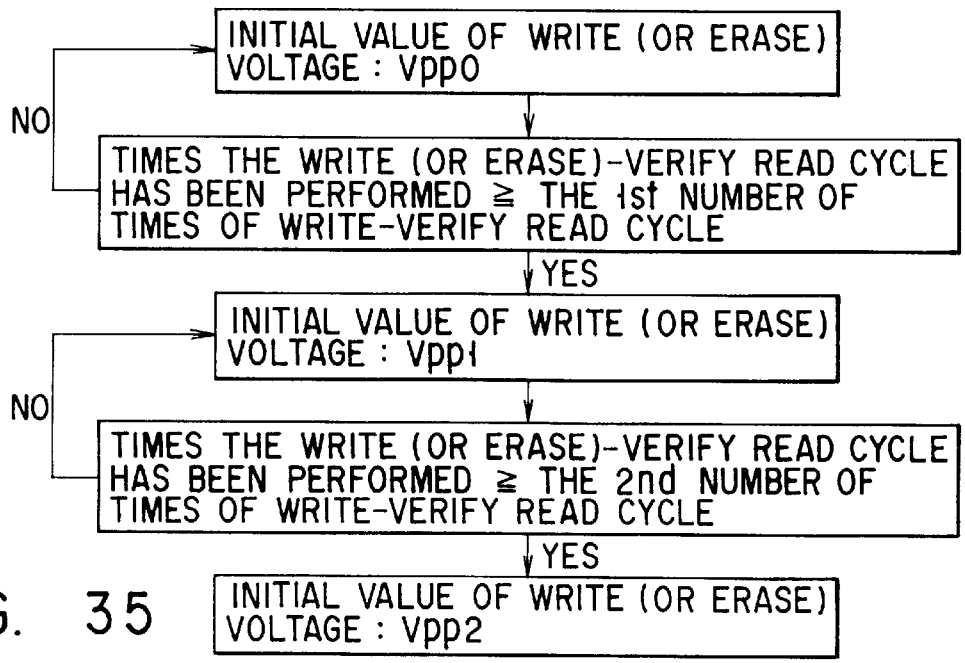
F I G. 35

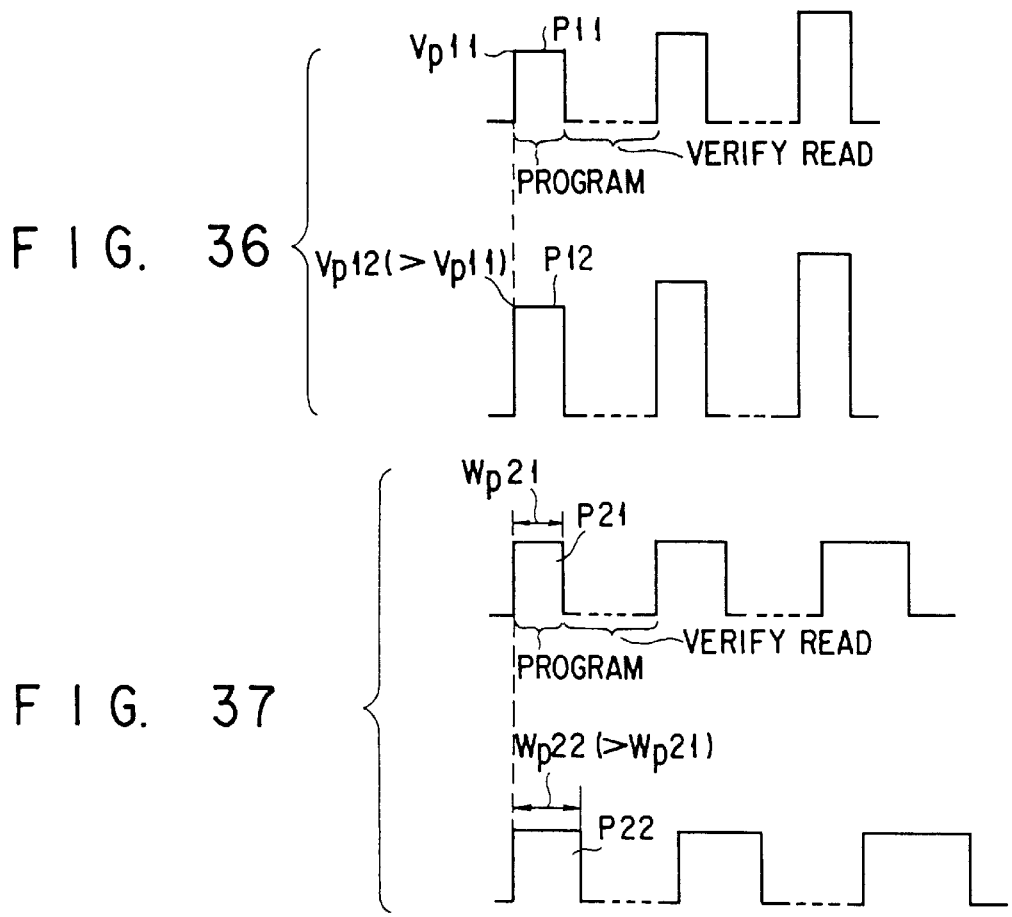
FIG. 36
FIG. 37
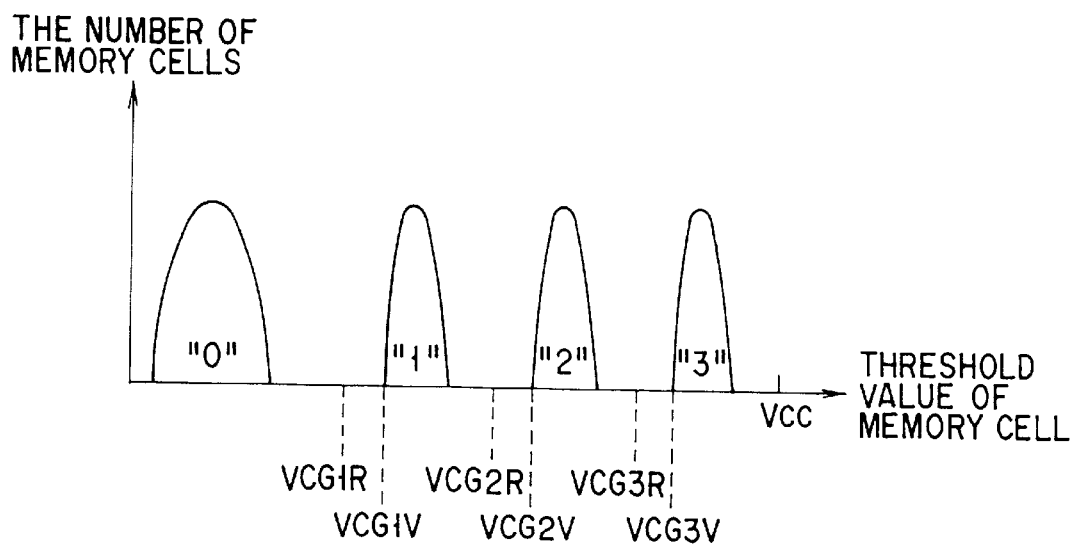
FIG. 41  PRIOR ART

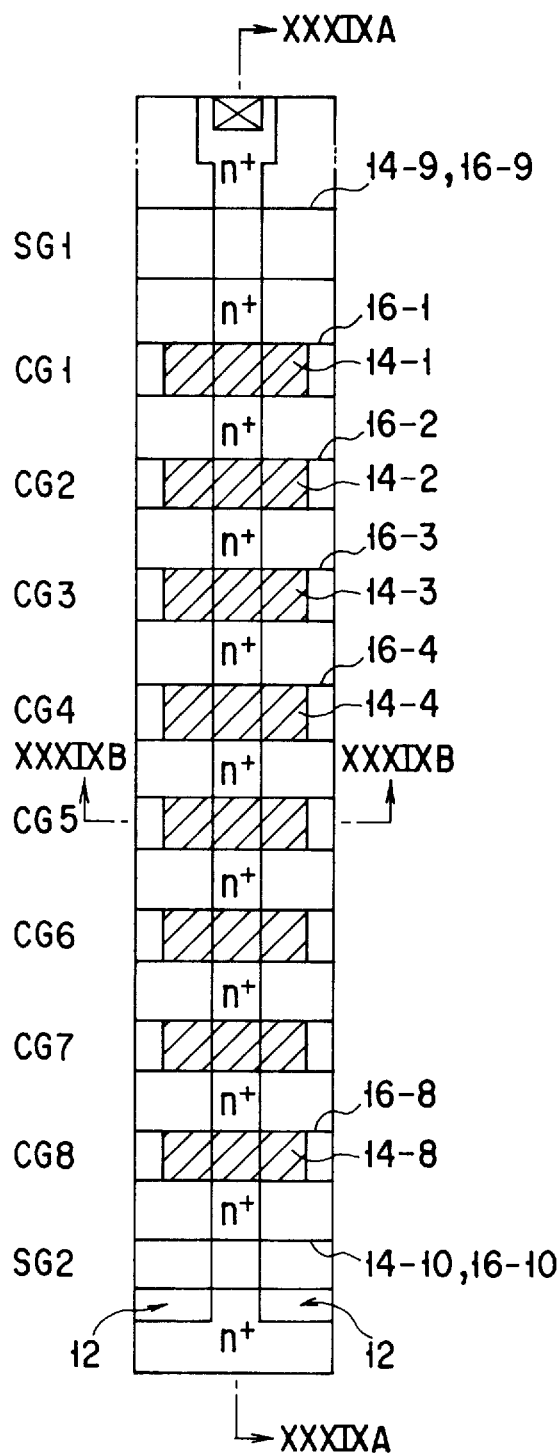
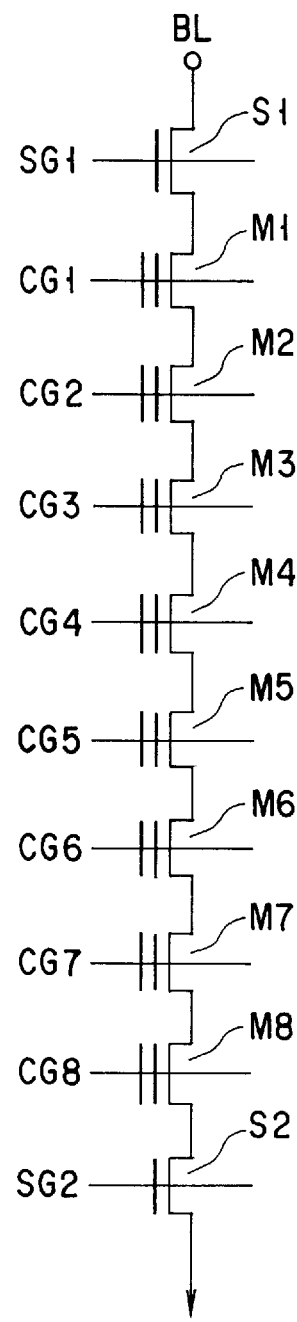
FIG. 38A
PRIOR ART
FIG. 38B
PRIOR ART

MEMORY SYSTEM

BACKGROUND OF THE INVENTION

The present invention relates to a memory system composed of an electrically erasable and programmable multi-level data storage nonvolatile semiconductor memory device (EEPROM).

In recent years, a NAND cell EEPROM has been suggested as one of electrically erasable and programmable nonvolatile semiconductor memory devices.

A NAND cell EEPROM is arranged such that a plurality of memory cells, each comprising a stacked gate type n-channel FETMOS structure with a floating gate and a control gate, are connected in series. The series-connected memory cells constitute one unit and are connected to a bit line.

FIG. 38A is a plan pattern view showing one NAND cell of a memory cell array, and FIG. 38B is a circuit diagram of the NAND cell. FIG. 39A is a cross sectional view taken along line XXXIXA—XXXIXA shown in FIG. 38A, and FIG. 39B is a cross sectional view taken along line XXXIXB—XXXIXB shown in FIG. 38A.

A p-type silicon substrate (or a p-type well) 11 has a surface having a device region surrounded by a device isolating oxide film 12. A NAND cell is formed in each device region. A plurality of NAND cells form one memory cell array.

Referring to FIGS. 38A, 38B, 39A and 39B, one of the NAND cells will now be described.

A semiconductor apparatus shown in FIGS. 38A, 38B, 39A and 39B has eight memory cells M1 to M8 connected in series to form one NAND cell. Each memory cell has a floating gate 14 (14-1, 14-2, ..., 14-8) formed on a substrate 11 through a gate insulating film 13. A control gate 16 (16-1, 16-2, ..., 16-8) is formed on the floating gate 14 through a second gate insulating film 15. An n-type diffusion layer 19, which is the source/drain of the memory cell is shared by adjacent memory cells. Thus, the eight memory cells are connected in series.

The NAND cell has, in the drain portion, first selection gates 14-9 and 16-9, and in the source portion, second selection gates 14-10 and 16-10, formed simultaneously with the floating gates 14-1 to 14-8 and the control gates 16-1 to 16-8. The substrate 11 having the devices, such as the memory cells, is covered with a CVD oxide film 17. A bit line 18 is disposed above the CVD oxide film 17. The control gates 16 of the NAND cell are formed to extend in the row direction to be made common with control gates of the corresponding memory cells of the NAND cell adjacent in the direction of the row to serve as word lines (control gates CG1, CG2, ..., CG8). The selection gates 14-9 and 16-9 and the selection gates 14-10 and 16-10 are formed to extend in the direction of the row, in a manner similar to the control gates 16-1 to 16-8, to be made common with the corresponding selection gates of a NAND cell adjacent in the direction of the row to serve as selection gates SG1 and SG2.

FIG. 40 is a circuit diagram showing a memory cell array having the NAND cells disposed in a matrix configuration.

As shown in FIG. 40, the source line is, through a contact, connected to a reference potential line made of aluminum or conductive polysilicon. The contact between the source line and the reference potential line is provided for each 64 bit lines. The reference potential line is connected to a peripheral circuit (not shown) which controls, for example, the potential to be applied to the source line to correspond to the operation mode.

The first and second selection gates SG1 and SG2 of the control gates CG1, CG2, ..., CG8 are formed to extend in the direction of the row. A set of memory cells connected to one control gate is, in general, called a page (one page), and a set of the pages held between one set of drain side (the first selection gate) and source side (the second selection gate) selection gates is called a NAND block (one NAND block) or a block (one block). One page is composed of, for example, 256 byte (256×8) memory cells. Writing of data is substantially simultaneously performed on the memory cells for one page. One block is composed of, for example, 2048 byte (2048×8) memory cells. Data is substantially simultaneously erased from the memory cells for one block.

The operation of the NAND EEPROM is performed as follows.

Writing of data is sequentially performed while starting at the farthest memory cell from the bit line.

Raised writing voltage Vpp (=about 20V) is applied to the control gate of the selected memory cell, an intermediate potential (=about 10V) is applied to the control gates of the non-selected memory cells and the first selection gates and 0V (writing of "0") or an intermediate potential (writing of "1") is applied to the bit line in accordance with data. At this time, the potential of the bit line is transmitted to the selected memory cell. When data is "0", high voltage is applied between the floating gate of the selected memory cell and the substrate so that electrons are tunnel-implanted from the substrate into the floating gate so that the threshold voltage is shifted in the positive direction. When data is "1", the threshold voltage is not changed.

Erase of data is performed substantially simultaneously in block units.

That is, when data is erased, all of the control gates and selection gates included in the blocks from which data is erased are made to be 0V, and then raised potential VppE (about 20V) is applied to the p-type silicon substrate (or the p-type well formed on the n-type substrate). The raised potential VppE is applied to the control gates and selection gates included in the blocks from which data is not erased. As a result, in the memory cells in the blocks from which data is erased, electrons stored in the floating gate are discharged to the p-type silicon substrate (or the p-type well) so that the threshold voltage is shifted in the negative direction.

The operation for reading data is performed such that the bit line is precharged, and then the bit line is brought to a floating state. Then, the control gate of the selected memory cell is made to be 0V, the control gates of the other memory cells and the selection gates are made to be power supply voltage Vcc (for example, 3V) and the source line is made to be 0V. As a result, whether or not an electric current flows in the selected memory cell is detected in accordance with change in the potential of the bit line. That is, if data written on the memory cell is "0" (if the threshold value of the memory cell satisfies Vth>0), the memory cell is turned off so that the bit line maintains the precharge potential. If data is "1" (if the threshold value of the memory cell satisfies Vth<0), the memory cell is turned on so that an electric current flows to cause the potential of the bit line to be lowered by *1V from the precharge potential. The potential of the bit line is detected by a sense amplifier so that data in the memory cell is read.

In recent years, a multi-level data storage cell structured such that information of three or more levels is stored in one cell has been known as one method capable of realizing a EEPROM having a large capacity (for example, refer to Japanese Patent Laid-Open No. 7-93979 and Japanese Patent Laid-Open No. 7-161852).

FIG. 41 is a graph showing the relationship between the threshold voltages of a memory cell and four writing states (four value data "0", "1", "2" and "3").

The state of data "0" is similar to the state after data has been erased and has, for example, a negative threshold value. The state of data "1" has a threshold voltage in a range from, for example, 0.5V to 0.8V. The state of data "2" has a threshold voltage in a range from, for example, 1.5V to 1.8V. The state of data "3" has a threshold voltage in a range from, for example, 2.5V to 2.8V.

Therefore, reading voltage VCG2R is applied to the control gate CG to detect whether the memory cell is turned on or off so as to detect whether data in the memory cell is "0" or "1" and whether the same is "2" or "3". In accordance with a result of the foregoing detection, reading voltage VCG3R or VCG1R is applied so that data in the memory cell is detected. The reading voltages VCG1R, VCG2R and VCG3R are, for example, 0V, 1V and 2V, respectively.

The voltages VCG1V, VCG2V and VCG3V are called verify voltages. When data is written, the verify voltages are applied to the control gate to detect the data writing state on the memory cell M, that is, whether or not data has been sufficiently written. The verify voltages VCG1V, VCG2V and VCG3V are, for example, 0.5V, 1.5V and 2.5V, respectively.

A flash memory involves a limited number of times of write-erase sequence such that, for example, the number of times of write-erase sequence for a two-level memory cell is limited to 1,000,000 times. The limitation of the number of times of write-erase sequence arises when electrons stored in the floating gate leak from the floating gate of the memory cell in the write state to the substrate if further write-erase sequence is performed. When electrons are leaked from the memory cell in the state of data "1" shown in FIG. 41 and thus the memory cell is brought to the state of data "0", written data is broken.

When multi-level data is stored in the memory cell, the difference between the multi-level data (for example, the difference in the voltage between the state "3" and the state "2" shown in FIG. 41) is reduced. As a result, if electrons in a slight quantity are leaked to the substrate, data in the state "3" is unintentionally changed to the state "2". If the memory cell is brought to the multi-level data mode, the threshold value of the highest threshold voltage (the state "3" in a state shown in FIG. 41) must be enlarged. Therefore, the electric field between the floating gate and the substrate is enlarged, thus causing the quantity of electrons leaked from the floating gate to be enlarged.

Under these circumstances, the more the number of data levels of the memory cell becomes, the more the reliability to the number of times of write-erase sequence deteriorates. Therefore, the number of permitted times of write-erase sequence is reduced to, for example, 500,000 times. As a result, the durability (the lifetime) of the semiconductor device deteriorates.

A conventional memory card (for example, refer to Niijima; IBM J. RES. DEVELOP. VOL. 39, No. 5 SEPTEMBER 1995) has a structure such that the number of times of write-erase sequence is recorded for each block and a block subjected to 1,000,000 times or more write-erase sequence operations is not used. However, also the foregoing method involves the number of times permitted for the memory card to be used being reduced as compared with the 2-level data memory mode when the number of the data levels is increased.

BRIEF SUMMARY OF THE INVENTION

In view of the foregoing, an object of the present invention is to provide a memory system including a multi-level data memory cell and exhibiting improved durability against write-erase sequence operations.

Another object of the present invention is to provide a memory system including a plurality of new system elements required for the memory system capable of achieving the foregoing object.

In order to achieve the foregoing objects, according to an aspect of the present invention, there is provided a memory system comprising a memory portion including a memory cell for storing n-level data (n is an integer equal to or larger than 3), wherein a memory cell is operated as an n-level data storing memory cell until the number of times write-erase sequence has been performed reaches a predetermined number of times of the write-erase sequence, and the memory cell is operated as an m-level data storing memory cell (m is an integer smaller than n) when the times the write-erase sequence has been performed has exceeded the predetermined number of times of the write-erase sequence.

A change of an n-level data memory mode to an m-level data memory mode may be performed in a memory chip unit including the memory portion.

The memory portion may include a memory cell block including a predetermined number of memory cells and serving as a unit for collectively writing or erasing data, and a change of n-level data memory mode to m-level data memory mode may be performed in the memory cell block unit.

Data may be neither written into the memory cell nor erased from the memory cell after the number of times the write-erase sequence has been performed reaches a limited number in an m level data memory mode after a change of an n-level data memory mode to the m-level data memory mode has been performed.

The memory cell may not be used after the number of times the write-erase sequence has been performed reaches a limited number in an m-level data memory mode after change of an n-level data memory mode to the m-level data memory mode has been performed.

Cycles may be repeated each of which includes a data writing or erasing operation into or from the memory cell and a verify read operation for detecting a state of the memory cell; the number of the repeated cycles of the data writing or erasing operation and the verify read operation may be monitored; and a change of the n-level data memory mode to the m-level data memory mode may be performed after the number of the repeated cycles has reached a predetermined number of times.

A data write voltage to the memory cell in a data write mode or an erase voltage to the memory cell in a data erase mode may be increased when the memory cell is operated as a m-level data memory cell after the number of times the write-erase sequence has been performed has exceeded the predetermined number of the write-erase sequence.

A width of a data write pulse to the memory cell in a data write mode or a width of a data erase pulse to the memory cell in a data erase mode may be increased when the memory cell is operated as a m-level data memory cell after the times the write-erase sequence has been performed has exceeded the predetermined number of the write-erase sequence.

The memory portion may include a memory cell block including a predetermined number of memory cells and serving as a unit for collectively writing or erasing data, and a change of n-level data memory mode to m-level data memory mode may be performed in the memory cell block unit.

The memory cell may be operated as a 2-level data storing memory cell when the number of times the write-erase sequence has been performed has exceeded the predetermined number of times of the write-erase sequence.

Cycles may be repeated each of which includes a data writing or erasing operation into or from the memory cell and a verify read operation for detecting a state of the memory cell; the number of the repeated cycles of the data writing or erasing operation and the verify read operation may be monitored; and a change of the n-level data memory mode to the 2-level data memory mode may be performed after the number of the repeated cycles has reached a predetermined number of times.

According to another aspect of the present invention, there is provided a memory system comprising a memory portion including a memory cell for storing n-level data (n is an integer equal to or larger than 3), wherein the memory cell is operated as an n-level data storing memory cell until the number of times write-erase sequence has been performed reaches an n-th number of times of the write-erase sequence, the memory cell is operated as an (n−1) level data storing memory cell after the n-th number of times of the write-erase sequence until the number of times the write-erase sequence has been performed reaches an (n−1)th number of times of the write-erase sequence, and the memory cell is operated as an i-level data storing memory cell (i is an integer equal to or larger than 2) after an (i+1)th number of the number of times of the write-erase sequence until times the write-erase sequence has been performed reaches an i-th number of times of the write-erase sequence.

A change of an n-level data memory mode to an (n−1) level data memory mode or a change of an (i+1) level data memory mode to an i-level data memory mode may be performed in a memory chip unit including the memory portion.

The memory portion may include a memory cell block including a predetermined number of memory cells and serving as a unit for collectively writing or erasing data, and a change of n-level data memory mode to (n−1) level data memory mode or a change of (i+1) level data memory mode to i-level data memory mode may be performed in the memory cell block unit.

Data may be neither written into the memory cell nor erased from the memory cell after the number of times the write-erase sequence has been performed reaches a limited number in an (n−1) level data memory mode after a change of an n-level data memory mode to the (n−1) level data memory mode has been performed or after the number of times the write-erase sequence has been performed reaches a limited number in an i-level data memory mode after a change of an (i+1) level data memory mode to the i-level data memory mode has been performed.

The memory cell may not be used after the number of times the write-erase sequence has been performed reaches a limited number in an (n−1) level data memory mode after change of an n-level data memory mode to the (n−1) level data memory mode has been performed or after the number of times the write-erase sequence has been performed reaches a limited number in an i-level data memory mode after change of an (i+1) level data memory mode to the i-level data memory mode has been performed.

According to a further aspect of the present invention, there is provided a memory system comprising a memory portion including a memory cell for storing n-level data (n is an integer equal to or larger than 3), further comprising a level holding portion for storing information of the level of data stored in the memory cell.

According to another aspect of the present invention, there is provided a memory system comprising a memory portion including a memory cell for storing n-level data (n is an integer equal to or larger than 3), comprising an n-level operation mode for operating the memory cell as an n-level data memory cell; and an m-level operation mode for operating the memory cell as an m-level data memory cell (m is an integer smaller than n).

Cycles may be repeated each of which includes a data writing or erasing operation into or from the memory cell and a verify read operation for detecting a state of the memory cell; the number of the repeated cycles of the data writing or erasing operation and the verify read operation may be monitored; and a change of the n-level data memory mode to the (n−1) level data memory mode or change of the (i+1) level data memory mode to the i-level data memory mode may be performed after the number of the repeated cycles has reached a predetermined number of times.

According to a further aspect of the present invention, there is provided a memory system comprising a memory portion including a memory cell for storing p-level data (p is an integer equal to or larger than 2), wherein cycles are repeated each of which includes a data writing or erasing operation into or from the memory cell and a verify read operation for detecting a state of the memory cell; the number of the repeated cycles of the writing operation or the erasing operation and the verify read operation is monitored; and data is neither written into the memory cell nor erased from the memory cell after the number of the repeated cycles has reached a predetermined number of times.

According to a further aspect of the present invention, there is provided a memory system comprising a memory portion including a memory cell for storing p-level data (p is an integer equal to or larger than 2), wherein cycles are repeated each of which includes a data writing or erasing operation into or from the memory cell and a verify read operation for detecting a state of the memory cell; the number of the repeated cycles of the writing operation or the erasing operation and the verify read operation is monitored; and the memory cell is not used after the number of the repeated cycles has reached a predetermined number of times.

A data writing voltage to the memory cell in a data write mode or a data erase voltage in a data erase mode may be increased when the memory cell is operated as a (n−1) level data memory cell after the number of times the write-erase sequence has been performed has exceeded the n-th number of the write-erase sequence or when the memory cell is operated as a i-level data memory cell after the number of times the write-erase sequence has been performed has exceeded the (i+1)th number of the write-erase sequence.

A width of a data write pulse to the memory cell in a data write mode or a width of a data erase pulse to the memory cell in a data erase mode may be increased when the memory cell is operated as a (n−1) level data memory cell after the number of times the write-erase sequence has been performed has exceeded the n-th number of the write-erase sequence or when the memory cell is operated as a i-level data memory cell after number of the times the write-erase sequence has been performed has exceeded the (i+1)th number of the write-erase sequence.

According to a further aspect of the present invention, there is provided a memory system comprising a memory portion including a memory cell for storing p-level data (p is an integer equal to or larger than 2), wherein cycles are repeated each of which includes a data writing or erasing operation into or from the memory cell and a verify read operation for detecting a state of the memory cell; the number of the repeated cycles of the writing operation or the erasing operation and the verify read operation is monitored; and a data write voltage to the memory cell in a data write mode or an erase voltage to the memory cell in a data erase mode is increased after the number of the repeated cycles has reached a predetermined number of times.

An initial value of a data write voltage in the repeated cycles to the memory cell in a data write mode or an initial value of an erase voltage in the repeated cycles to the memory cell in a data erase mode may be increased after the number of the repeated cycles has reached a predetermined number of times.

According to a further aspect of the present invention, there is provided a memory system comprising a memory portion including a memory cell for storing p-level data (p is an integer equal to or larger than 2), wherein cycles are repeated each of which includes a data writing or erasing operation into or from the memory cell and a verify read operation for detecting a state of the memory cell; the number of the repeated cycles of the writing operation or the erasing operation and the verify read operation is monitored; and a width of a data write pulse to the memory cell in a data write mode or a width of a data erase pulse to the memory cell in a data erase mode is increased after the number of the repeated cycles has reached a predetermined number of times.

A width of an initial value of a data write pulse in the repeated cycles to the memory cell in a data write mode or a width of an initial value of a data erase pulse in the repeated cycles to the memory cell in a data erase mode may be increased after the number of the repeated cycles has reached a predetermined number of times.

According to a further aspect of the present invention, there is provided a memory system comprising a memory portion including a memory cell for storing p-level data (p is an integer equal to or larger than 2), wherein the number of times the data write-erase sequence has been performed is monitored; and a data write voltage to the memory cell in a data write mode or an erase voltage to the memory cell in a data erase mode is increased after the number of the times of the data write-erase sequence has reached a predetermined number of times.

Cycles are repeated each of which includes a data writing or erasing operation into or from the memory cell and a verify read operation for detecting a state of the memory cell; and an initial value of a data write voltage in the repeated cycles to the memory cell in a data write mode or an initial value of an erase voltage in the repeated cycles to the memory cell in a data erase mode may be increased after the number of times of the data write-erase sequence has reached a predetermined number of times.

According to a further aspect of the present invention, there is provided a memory system comprising a memory portion including a memory cell for storing p-level data (p is an integer equal to or larger than 2), wherein the number of times the data write-erase sequence has been performed is monitored; and a width of a data write pulse to the memory cell in a data write mode or a width of a data erase pulse to the memory cell in a data erase mode is increased after the number of times of the data write-erase sequence has reached a predetermined number of times.

Cycles are repeated each of which includes a data writing or erasing operation into or from the memory cell and a verify read operation for detecting a state of the memory cell; and a width of an initial value of a data write pulse in the repeated cycles to the memory cell in a data write mode or a width of an initial value of a data erase pulse in the repeated cycles to the memory cell in a data erase mode may be increased after the number of times of the data write-erase sequence has reached a predetermined number of times.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a block diagram showing a flash memory according to a second embodiment of the present invention;

FIG. 5 shows a structure of a chip of the flash memory shown in FIG. 4;

FIG. 6 is a block diagram showing a memory system according to a modification of the second embodiment of the present invention;

FIG. 7 is a flow chart of the operation of a first memory system according to a third embodiment of the present invention;

FIG. 12 is a flow chart of the operation of a ninth memory system according to the third embodiment of the present invention;

FIG. 13 is a flow chart of the operation of a tenth memory system according to the third embodiment of the present invention;

FIG. 14 is a flow chart of the operation of an eleventh memory system according to the third embodiment of the present invention;

FIG. 15 is a flow chart of the operation of a twelfth memory system according to the third embodiment of the present invention;

FIG. 16 is a flow chart of the operation of a thirteenth memory system according to the third embodiment of the present invention;

FIG. 17 is a block diagram showing a multi-level data storage EEPROM according to a fourth embodiment of the present invention;

FIG. 18 is a block diagram showing the structures of the memory cell array and the data circuit shown in FIG. 17;

FIG. 19 is a graph showing the threshold voltages and 4-level data in the multi-level data storage EEPROM according to the fourth embodiment of the present invention:

FIG. 20 is a circuit diagram showing the memory cell array and the data circuit shown in FIG. 17;

FIG. 22 is a table showing the relationship between the potentials of nodes of a flip-flop and 4-level data;

FIG. 23 is a table showing the relationship between the potentials of the nodes of the flip-flop and 4-level data;

FIG. 24 is a table showing the relationship between the potentials of the nodes of the flip-flop and 4-level data;

FIG. 28 is a graph showing the threshold voltages and 2-level data in the multi-level data storage EEPROM according to the fourth embodiment of the present invention;

FIG. 29 is a table showing the relationship between the potentials of the flip-flop and 2-level data;

FIG. 30 is a timing chart of a writing operation;

FIG. 31 is a timing chart of a write verify operation;

FIG. 32 is a timing chart of a reading operation;

FIG. 33 is a flow chart of the operation of a first memory system according to a fifth embodiment of the present invention;

FIG. 34 is a flow chart of the operation of a second memory system according to the fifth embodiment of the present invention;

FIG. 35 is a flow chart of the operation of a third memory system according to the fifth embodiment of the present invention;

FIG. 36 shows wave forms of data write pulses;

FIG. 37 shows wave forms of data write pulses;

FIG. 38A is a diagram showing plan pattern of a NAND cell portion of the memory cell array;

FIG. 38B is a circuit diagram of the NAND cell portion;

FIG. 41 is a graph showing the relationship between threshold voltages and 4-level data in the memory cell.

DETAILED DESCRIPTION OF THE INVENTION

Embodiments of the present invention will now be described such that a multi-level data NAND flash memory is taken as an example.

FIGS. 1, 2A–2C, and 3A–3B are graphs showing the relationship between the threshold voltages and multi-level data in each memory mode of the multi-level data NAND flash memory according to a first embodiment of the present invention.

Figure 1:
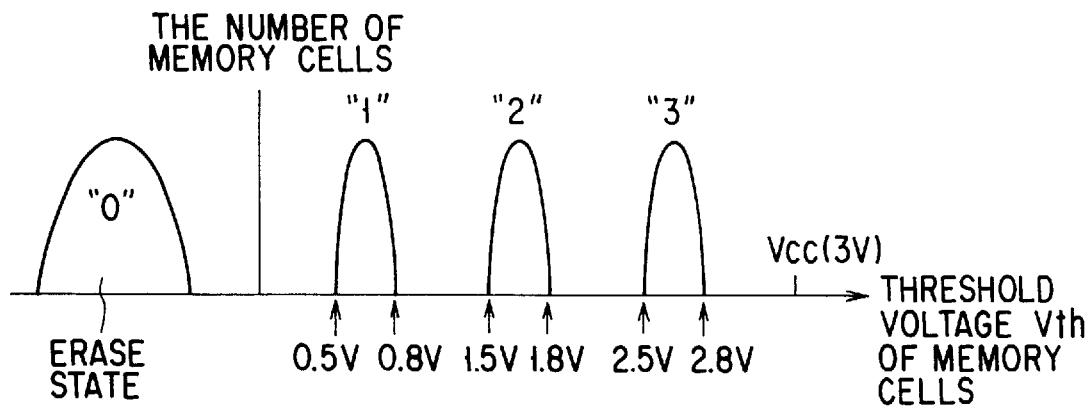
FIG. 1 is a graph showing the relationship between the threshold voltages and 4-level data in a multi-level data NAND flash memory according to a first embodiment of the present invention.
Figure 3A:
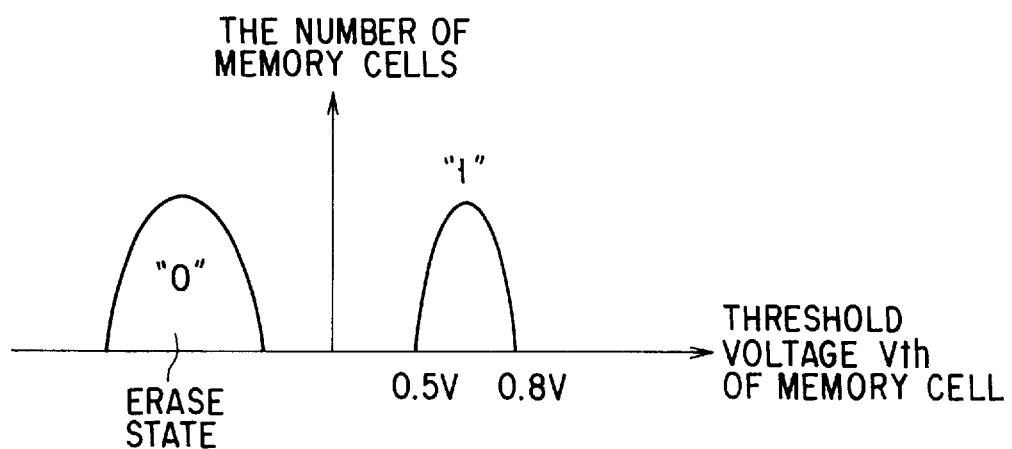
FIGS. 3A and 3B are graphs each showing the relationship between the threshold voltages and 2-level data in a multi-level data NAND flash memory according to the first embodiment of the present invention.
Figure 3B:
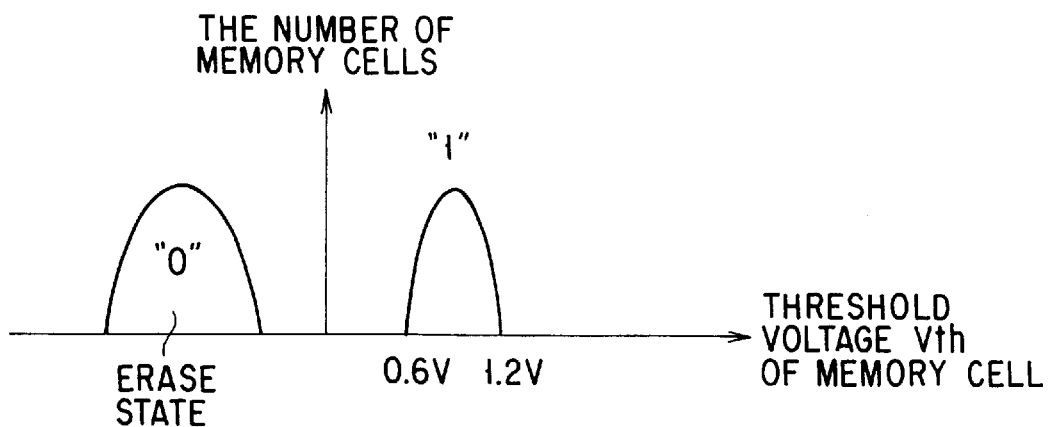
Figure 2A:
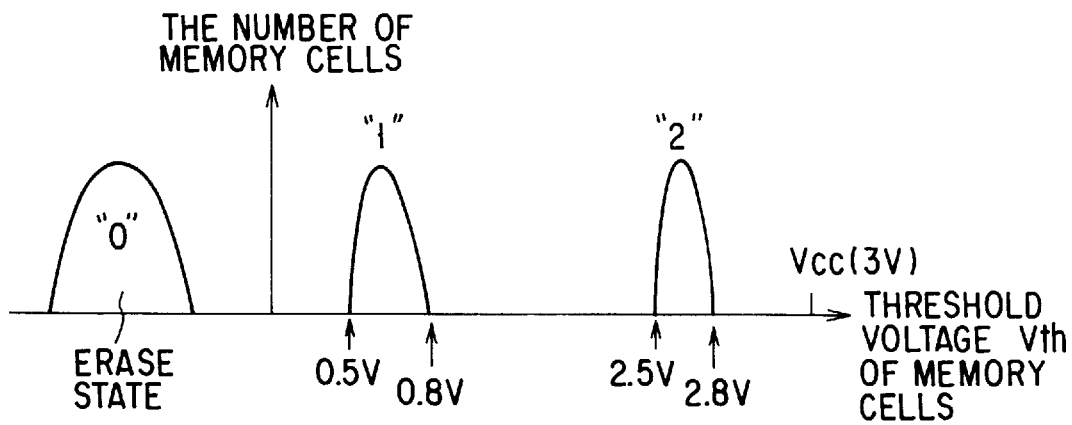
FIGS. 2A, 2B and 2C are graphs each showing the relationship between the threshold voltages and 3-level data in a multi-level data NAND flash memory according to the first embodiment of the present invention.
Figure 2B:
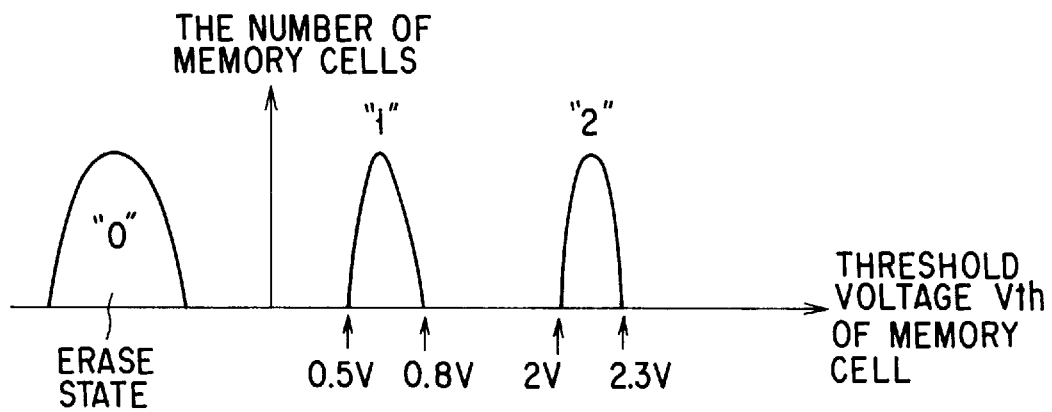
Figure 2C:
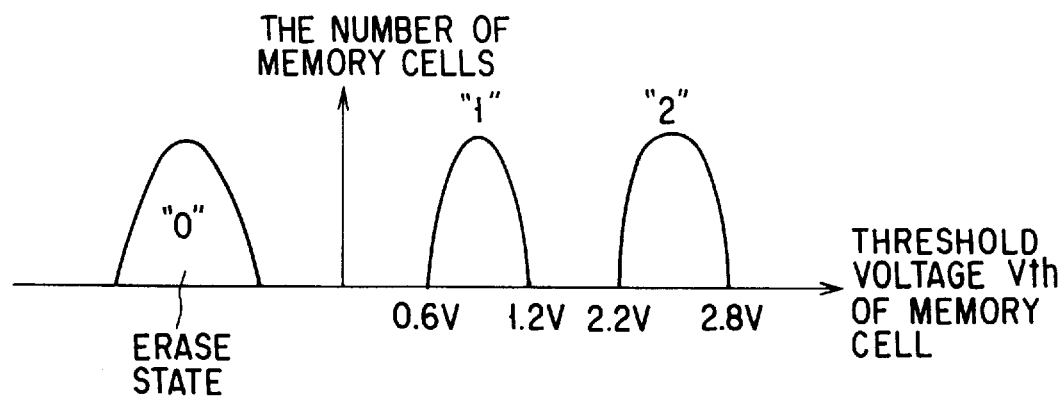

FIG. 1 shows an example of the relationship between threshold voltages and 4-level data. FIGS. 2A to 2C show three examples of the relationship between the threshold voltages and the 3-level data in the 3-level operation mode. FIGS. 3A and 3B show two examples of the relationship between the threshold voltages and 2-level data in a 2-level operation mode.

Referring to FIGS. 1, 2A to 2C, 3A and 3B, state "0" is an erasing state, and "1", "2" and "3" are writing states. The operation (writing, reading and erasing) in the chip of the multi-level data NAND flash memory is performed as disclosed in Japanese Patent Laid-Open No. 7-93979, Japanese Patent Laid-Open No. 7-161852, Japanese Patent Application No. 7-295137, Japanese Patent Application No. 8-61443 and Japanese Patent Application No. 8-61445.

In the EEPROM, the number of times the write-erase sequence can be performed decreases as the number of data levels increases. For example, a 4-level data memory cell having the 4-level data storage state as shown in FIG. 1 is limited to 500,000 times of write-erase sequence, a 3-level data memory cell having the 3-level data storage state as shown in FIGS. 2A to 2C is limited to 800,000 times of write-erase sequence, and a 2-level data memory cell having the 2-level data storage state as shown in FIGS. 3A and 3B is limited to 1,000,000 times of write-erase sequence.

According to the present invention, the memory cell is used as a 4-level data memory cell having a storage state as shown in FIG. 1. After 500,000 times of write-erase sequence have been performed, the memory cell is used as a 3-level data memory cell as shown in FIGS. 2A to 2C. After 800,000 times of write-erase sequence have been performed, the memory cell is used as a 2-level data memory cell as shown in FIGS. 3A and 3B.

To simplify the operation method of the semiconductor device, the structure may be arranged such that the memory cell is used as the 4-level data memory cell until 500,000 times of write-erase sequence is performed and is used as the 2-level data memory cell after 500,000 times of write-erase sequence have been performed without being used as the 3-level data memory cell.

If the number of times the write-erase sequence has been performed for the 4-level data memory cell exceeds the limited number of times, the memory cell is sequentially used as the 3-level data memory cell and the 2-level data memory cell or as the 2-level data memory cell. Thus, the number of times of write-erase sequence permitted for the flash memory can be increased. Therefore, the multi-level data storage flash memory according to the present invention is able to improve the durability against write-erase sequence as compared with the conventional multi-level data storage flash memory.

The present invention improves the durability of a single flash memory, that is, the durability of a semi-conductor chip and that of a memory device by including the flash memory into a variety of memory devices (for example, a memory card).

Whether the memory cell is operated as the 4-level data memory cell or a 3-level data memory cell or a 2-level data memory cell may be controlled by inputting a command to the flash memory from outside of the chip. That is, the flash memory is provided with the following operation modes consisting of a writing operation mode (or an operation method)/reading operation mode (or an operation method) for 4-level data, a writing operation mode (or an operation method)/reading operation mode (or an operation method) for 3-level data and a writing operation mode (or an operation method)/reading operation mode (or an operation method) for 2-level data. Any one of the operation modes (or the operation methods) may be selected by inputting a command.

Whether the memory cell is operated as the 4-level data memory cell or the 3-level data memory cell or the 2-level data memory cell may be controlled in accordance with write data supplied from a controller for controlling the flash memory. That is, a structure may be employed in which the internal operation of the flash memory is not changed but the memory cell is sequentially operated as the 4-level data memory cell, the 3-level data memory cell and the 4-level data memory cell or as the 2-level data memory cell after it has been operated as the 4-level data memory cell in accordance with the contents of write data supplied from the outside. When the memory cell is operated as the 4-level data memory cell, 4-level data "0", "1", "2" and "3" is supplied. When the memory cell is operated as the 3-level data memory cell, 3-level data "0", "1" and "2" is supplied. When the memory cell is operated as the 2-level data memory cell, 2-level data "0" and "1" is supplied. As described above, the value of input data may be controlled in accordance with the operation mode of the memory cell.

If the number of times of the write-erase sequence for the 2-level data memory cell exceeds the limited number of times, use of the memory cell may be inhibited.

If the number of times of the write-erase sequence for the 2-level data memory cell exceeds the limited number of times, writing of data into the memory cell or erasing of data from the memory cell may be inhibited. Since in such a case write-erase sequence of data to the memory cell is inhibited, the memory cell may be used as a ROM. When the memory cell is used as a ROM, particularly, the degree of degradation of the tunnel oxide film determines the time period in which data can be stored. Even if the number of times of the write-erase sequence reaches the limited number of times, the memory cell generally has reliability to serve as the ROM. The reason for this is that the limited number of times of the write-erase sequence has been set to have a certain margin to the moment at which the tunnel oxide film can no longer be used.

A memory system according to a second embodiment will now be described.

FIG. 4 is a block diagram showing a flash memory according to a second embodiment of the present invention.

As shown in FIG. 4, a controller 100 controls k (k is an integer) chips 101-1 to 101-k of a multi-level data NAND flash memory.

FIG. 5 is a block diagram showing one chip, for example, chip 101-1, of the multi-level data NAND flash memory shown in FIG. 4. Each chip shown in FIG. 4 includes a plurality of memory cells each of which has a threshold voltage distribution corresponding to the multi-level data storage level, like those according to the first embodiment of the present invention. The threshold voltage distribution is similar to that shown in FIGS. 1, 2A to 2C, 3A and 3B such that "0" is the erasing state, and "1", "2" and "3" are writing states, as shown in FIGS. 1, 2A to 2C, 3A and 3B.

The operation (writing, reading and erasing) in the chip of the multi-level data NAND flash memory is performed as disclosed in Japanese Patent Laid-Open No. 7-93979, Japanese Patent Laid-Open No. 7-161852, Japanese Patent Application No. 7-295137, Japanese Patent Application No. 8-61443 and Japanese Patent Application No. 8-61445.

One page, which is a unit on which data is written simultaneously, is composed of 528-byte pieces of memory cells. Among 528-byte pieces of memory cells, 512-byte pieces of memory cell constitute a data region, while remaining 16-byte pieces of memory cell store an address conversion table showing the correspondence between the logical addresses and physical addresses, error correcting codes (Error Correcting Code: ECC).

Referring to FIG. 5, one chip is composed of 512 blocks from block 0 to block 511. One block, which is a unit from which data is simultaneously erased, is composed of 16 pages from page 0 to page 15. For example, leading end block Block 0 is used as a system region. That is, Block 0 is required to store the number of times of write-erase sequence in each block, information of broken block, or block sequence number S. The block sequence number S and the like have been disclosed in Niijima; IBM J. RES. DEVELOP. VOL. 39, No. 5 SEPTEMBER 1995. In this case, whenever writing and erasing are repeated, the number of write-erase sequence is rewritten in the leading end block which stores the number of write-erase sequence. Since write-erase sequence is, as described above, frequently performed in the system block, the lifetime of the memory cell in the system region is sometimes shortened as compared with the lifetime of the memory cell in the other data region.

FIG. 6 is a block diagram showing a modification of the memory system according to the second embodiment.

If the lifetime of the system region is shorter than that of the memory cells in the other regions, a DRAM 102 for storing the system region, such as a region for recording the number of write-erase sequence, may be provided, as shown in FIG. 6. When the power supply is turned on (i.e., in operation), data in the system region of the flash memory is read and stored in the DRAM. Thereafter, write-erase sequence of the system region is performed with respect to data write, data erase, or data write-erase sequence. At this time, the system region stored in the DRAM is subjected to the write-erase sequence. In accordance with data in the system region in the DRAM, data in the system region in the flash memory is subjected to the data write-erase sequence when the power source is turned-off or every predetermined period of time.

As described above, write-erase sequence of the system region during the operation is performed such that data in the DRAM is subjected to the data write-erase sequence. Therefore, frequent write-erase sequence of the system region in the flash memory can be prevented.

If the address conversion table must be rewritten when data is written, erased or rewritten, the contents of the address conversion table may be stored in the DRAM and also write-erase sequence may be performed in the DRAM.

In this embodiment, a 4-level data flash memory will be described as an example. For example, a 4-level data memory cell structured as shown in FIG. 1 can be written 500,000 times, while a 2-level data memory cell structured as shown in FIGS. 3A and 3B can be written 1,000,000 times.

According to this embodiment, the memory cell is used in a 4-level data mode to serve as a 4-level data memory cell as shown in FIG. 1 until write-erase sequence is performed 500,000 times. The number of times of the write-erase sequence for each block is stored in a region for storing the number of write-erase sequence in the system region on the flash memory when the power supply is turned off. When the power supply is turned on (i.e., in operation), it is stored in the region for recording the number of write-erase sequence in the DRAM.

After 500,000 times of write-erase sequence have been performed, the memory cell is used in the 2-level data mode to serve as a 2-level data memory cell. A change between the 4-level mode and the 2-level mode may be performed in one page unit or one block unit or in a unit of plural blocks or chip unit. A level holding means for storing information whether each page, each block or each chip is in the 2-level data mode or the 4-level data mode stores information about the operation mode in the system region of the flash memory when the power supply is turned off. When power supply is turned on (i.e., in operation), the information is stored in the DRAM. When electric power has been supplied, the level holding means is read to determine the level at which the memory cell is operated.

As described above, the memory cell is used as the 2-level data memory cell if the number of times of the performed write-erase sequence exceeds the limited number of times for the 4-level data memory cell. Thus, the number of times of the write-erase sequence permitted for the flash memory to be used can be increased.

Whether the memory cell is operated as the 4-level data memory cell or the 2-level data memory cell may be controlled by inputting a command to the flash memory from the controller 100. That is, the flash memory is provided with the following operation modes consisting of a writing operation mode (or an operation method)/reading operation mode (or an operation method) for 4-level data and a writing operation mode (or an operation method)/reading operation mode (or an operation method) for 2-level data. Either of the provided operation mode (or the operation method) may be selected by inputting a command.

Whether the memory cell is operated as the 4-level data memory cell or the 2-level data memory cell may be controlled in accordance with write data supplied from a controller 100 for controlling the flash memory. That is, a structure may be employed in which the internal operation of the flash memory is not changed but the memory cell is sequentially operated as the 4-level data memory cell or the 2-level data memory cell in accordance with the contents of write data supplied from the outside. When the memory cell is operated as the 4-level data memory cell, 4-level data "0", "1", "2" and "3" is supplied. When the memory cell is operated as the 2-level data memory cell, 2-level data "0" and "1" is supplied.

The number of memory cells in the data region in one page may be made to be different between the 4-level mode and the 2-level mode. In either case of the 4-level mode or the 2-level mode, for example, 512-byte pieces of memory cells of the 528-byte pieces of memory cells may form the data region and 16-byte memory cells, which are the remaining memory cells, may store the address conversion table showing the correspondence between the logical address and the physical address and the error correcting code (ECC). As an alternative to this, the regions for the address conversion table and the ECC region may be optimized for each of the 4-level mode and the 2-level mode. A structure may be employed in which the 4-level mode is arranged such that the regions for the address conversion table and the ECC use 16-byte pieces of memory cells and in which the 2-level data mode uses 24-byte pieces of memory cells or 8-byte pieces of memory cells. In any case, regions except the address conversion table and the ECC may be used as the data region.

Since data in the region for recording the number of write-erase sequence is updated whenever the write-erase sequence in each block is performed, monitoring of the region for storing the number of times of the write-erase sequence enables the level at which the memory cell is operated to be determined. That is, the region for recording the number of times of the performed write-erase sequence in the DRAM is read before a write-erase sequence is performed. If the number of write-erase sequence in the block in which data is written is 500,000 times or smaller, writing is performed by making the block as a 4-level data memory cell. If the number of write-erase sequence is larger than 500,000 times, the contents in the level holding means in the DRAM are changed from the 4-level data memory cell to the 2-level data memory cell and data is written in the block as the 2-level data memory cell. If the number of times of write-erase sequence exceeds 1,000,000 times, use of the block may be inhibited or writing and erasing of data with respect to the block may be inhibited.

The second embodiment has the structure such that the number of times of write-erase sequence is recorded for each block and the level at which each block is operated is determined. The unit, the level of which is determined, is not limited to the block. For example, one region for recording the number of times of write-erase sequence may be provided for the plural blocks and the level at which a unit of plural blocks is operated may be determined. As an alternative to this, one region for recording the number of times of write-erase sequence may be provided for each chip of the flash memory and the level at which a unit of the chips is operated may be determined. Another structure may be employed in which the number of times of write-erase sequence may be monitored for each page unit and the level at which each page unit is operated may be determined.

Although the second embodiment has the structure such that the number of times of write-erase sequence is monitored and the fact that the level at which the memory cell is operated is determined. As an alternative to this, time taken from, for example, shipping may be monitored to determined the level at which the memory cell is operated.

A memory system according to a third embodiment of the present invention will now be described with reference to FIGS. 7 to 16.

A plurality of memory systems according to the present invention will now be described as the memory systems according to the third embodiment.

FIG. 7 is a flow chart showing the operation of a first memory system according to the third embodiment.

The first memory system includes a memory cell for storing n-level data (n is an integer equal to or larger than 3 and is, for example, 3 or 4 or 8 or 16). The first memory system is structured such that the memory cell is operated as an n-level data memory until the number of times of write-erase sequence is not more than a predetermined number of times of write-erase sequence (for example, 500,000 times), as shown in FIG. 7. When the number of times of write-erase sequence is larger than 500,000, the memory cell is operated as an m-level (m is an integer smaller than n) memory cell.

As described in the second embodiment, the number of times of write-erase sequence may be recorded on the region for storing the number of times of write-erase sequence for each block or each chip and the region for storing the number of times of write-erase sequence is monitored so as to determine the level at which the memory cell is operated.

Figure 8:
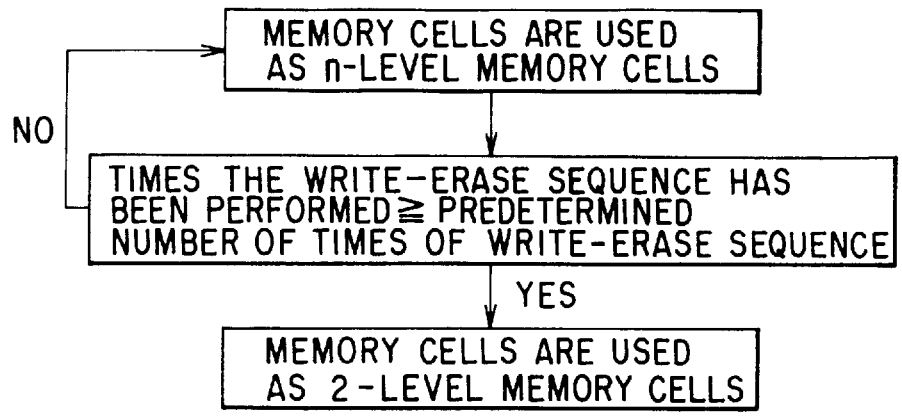
FIG. 8 is a flow chart of the operation of a second memory system according to the third embodiment of the present invention.

FIG. 8 is a flow chart showing the operation of a second memory system according to the third embodiment.

The second memory system includes a memory cell for storing n-level data (n is an integer equal to or larger than 3 and is, for example, 3 or 4 or 8 or 16). The second memory system is structured such that the memory cell is operated as an n-level data memory until the number of times of write-erase sequence is not more than a predetermined times of write-erase sequence, as shown in FIG. 8. When the number of times of write-erase sequence is larger than the predetermined times of write-erase sequence, the memory cell is operated as a 2-level data memory cell.

Figure 9:
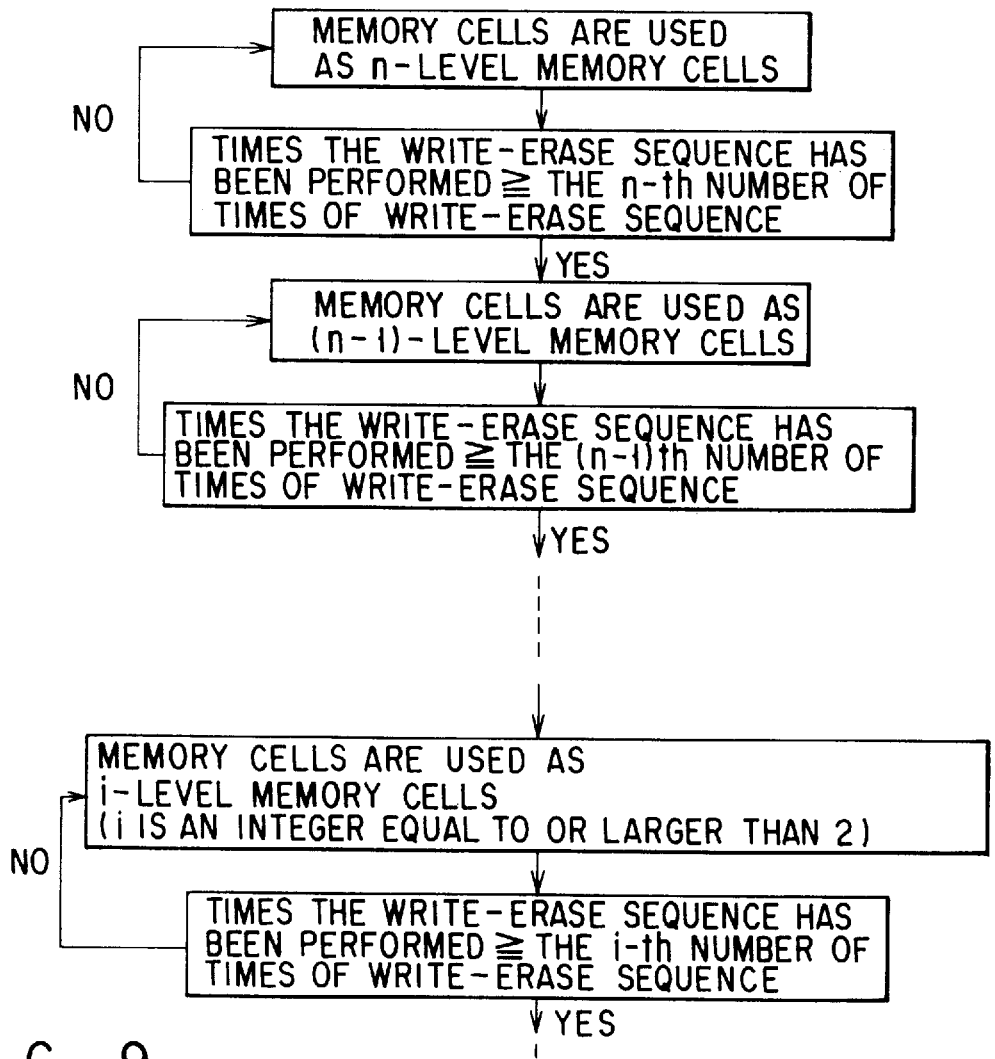
FIG. 9 is a flow chart of the operation of a third memory system according to the third embodiment of the present invention.

FIG. 9 is a flow chart showing the operation of a third memory system according to the third embodiment.

The third memory system includes a memory cell for storing n-level data (n is an integer equal to or larger than 3 and is, for example, 3 or 4 or 8 or 16). As shown in FIG. 9, the third memory system is structured such that the memory cell is operated as an n-level data memory until the number of times of the performed write-erase sequence reaches an n-th number of times of write-erase sequence. After performing the n-th number of times of write-erase sequence, until the number of times of performed write-erase sequence reaches an (n−1)th number of times of write-erase sequence, the memory cell is operated as a (n−1) level data memory cell. After performing (i+1)th number of times of write-erase sequence (i is an integer larger than 2), until the number of times of performed write-erase sequence reaches an i-th number of times of write-erase sequence, the memory cell is operated as an i-level data memory cell.

Note that the predetermined number of times of write-erase sequence set for the n-level data memory cell, the (n−1) level data memory cell and the i-level data memory cell respectively are defined as n-th number of times of write-erase sequence, (n−1)th number of times of write-erase sequence and i-th number of times of write-erase sequence which are similarly applied hereinafter.

A fourth memory system is a semiconductor device including a memory cell for storing n-level data (n is an integer equal to or larger than 3 and is, for example, 3 or 4 or 8 or 16). The fourth memory system includes a level holding means for storing the level of data stored by the memory cell.

The level holding means is required to be structured such that the contents of storage are stored in, for example, the first block of the flash memory chip, for example, Block 0 shown in FIG. 5.

As an alternative to this, a structure may be employed in which the level holding means is read when electric power has been supplied and the stored contents are stored in the DRAM 102 shown in FIG. 6. When the region for storing the number of times of write-erase sequence is read and a determination has been made that the number of times of write-erase sequence has reached 500,000 times, the contents of the level holding means are changed so as to cause the memory cell to operate as a 2-level memory cell. Then, the level holding means is read to cause the memory cell to operate as the 2-level data memory cell and writing is performed. That is, this embodiment has the structure such that the level holding means is read when, for example, electric power has been supplied so that the level at which the memory cell is operated is determined.

A fifth memory system is a semiconductor storage device including a memory cell for storing n-level data (n is an integer equal to or larger than 3 and is, for example, 3 or 4 or 8 or 16). A predetermined number of memory cells form a memory cell block so that writing or erasing is performed in units of the memory cell blocks. In the fifth memory system, memory cells in the memory cell block are operated as n-level memory cells until the number of times of write-erase sequence reaches a predetermined number of times. If the number of times of performed write-erase sequence exceeds the predetermined number of times, all of the memory cells in the memory cell block are operated as an m (m is an integer small than n) level memory cells.

The fifth memory system has a region for storing the number of times of write-erase sequence in the memory cell block provided for each memory cell block. The level at which the memory cell block is operated may be determined in accordance with the number of times of write-erase sequence stored in the region for storing the number of times of write-erase sequence.

The memory cell block is not limited to a so-called "block" which is a set of a plurality of pages interposed between one drain side selection gate and one source side selection gate. The memory cell block is a memory cell group to and from which data is write-erase sequence or erased simultaneously. Since the NAND EEPROM is generally structured such that writing is performed in page units and erasing is performed in block units, the pages and blocks correspond to the memory cell blocks.

A sixth memory system is a semiconductor storage device including a memory cell for storing n-level data (n is an integer equal to or larger than 3 and is, for example, 3 or 4 or 8 or 16). The memory cells in the sixth system are operated as n-level memory cells until the number of times of performed write-erase sequence exceeds a predetermined times of write-erase sequence. If the number of times of the performed write-erase sequence exceeds the predetermined number of times, all of the memory cells in the chip including the memory cell are operated as an m (m is an integer smaller than n) level memory cells.

The sixth memory system has a region on the chip for storing the number of times of the performed write-erase sequence. The region for storing the number of times of the performed write-erase sequence is provided for each chip. The level at which the chip is operated may be determined in accordance with the number of times of the performed write-erase sequence stored in the region for storing the number of times of the performed write-erase sequence.

Figure 10:
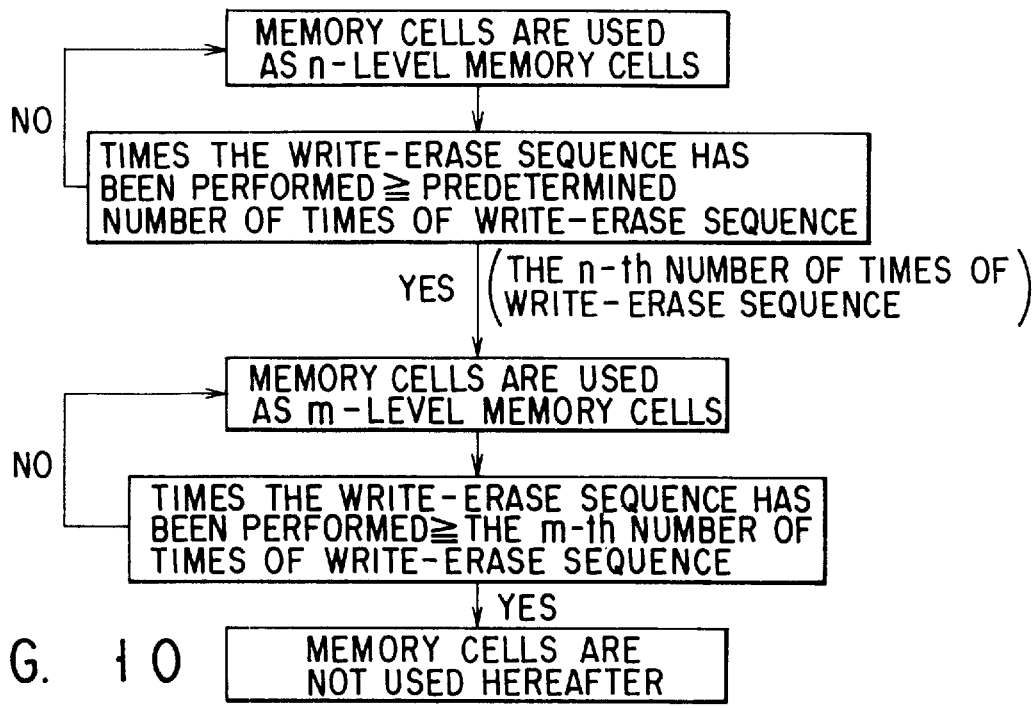
FIG. 10 is a flow chart of the operation of a seventh memory system according to the third embodiment of the present invention.

FIG. 10 is a flow chart showing the operation of a seventh memory system according to the third embodiment.

The seventh memory system includes a memory cell for storing n-level data (n is an integer not smaller than 3 and is, for example, 3 or 4 or 8 or 16), as shown in FIG. 10. The seventh memory system is arranged such that the memory cells are operated as n-level memory cells until the number of times of performed write-erase sequence to the memory cell reaches an n-th number of times. After performing the n-th number of times of write-erase sequence, until the number of times of performed write-erase sequence reaches m-th number of times of write-erase sequence, the memory cells are operated as m (m is an integer smaller than n) level memory cells. If the number of the times of the performed write-erase sequence exceeds the m-th number of times of write-erase sequence, the memory cells are not used.

Figure 11:
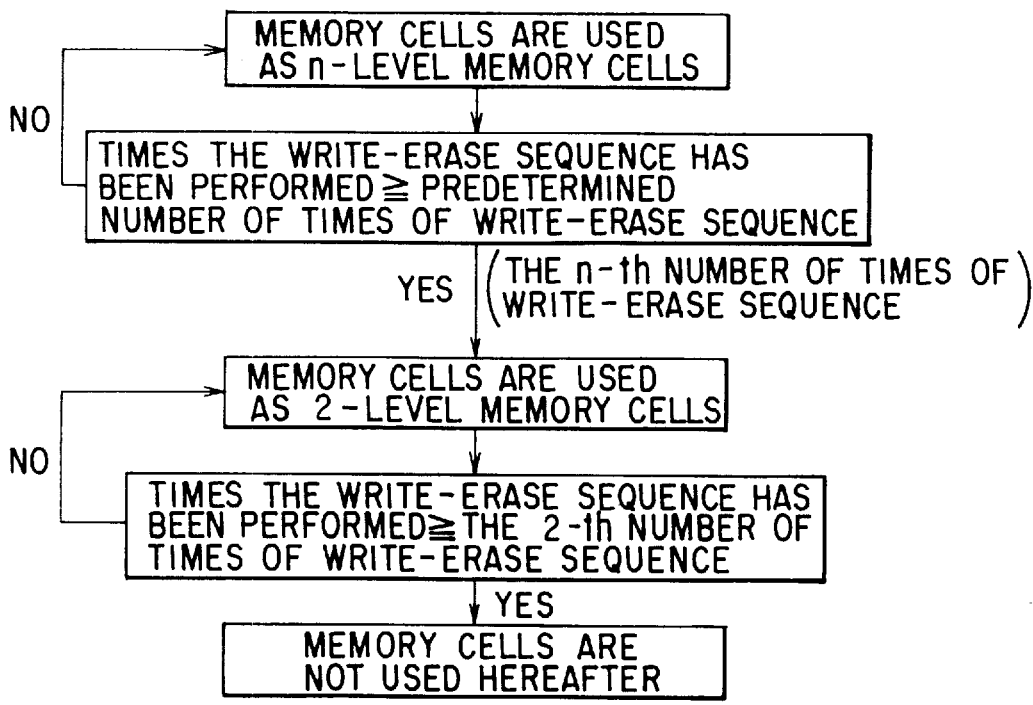
FIG. 11 is a flow chart of the operation of an eighth memory system according to the third embodiment of the present invention.

FIG. 11 is a flow chart of the operation of an eighth memory system according to the third embodiment.

The eighth memory system includes a memory cell for storing n-level data (n is an integer equal to or larger than 3 and is, for example, 3 or 4 or 8 or 16). The eighth memory system is structured such that the memory cells are operated as n-level memory cells until the number of performed write-erase sequence reaches the n-th number of times, as shown in FIG. 11. After performing the n-th number of times of write-erase sequence, until the number of times of performed write-erase sequence reaches a second number of times of write-erase sequence, the memory cells are operated as 2-level memory cells. If the number of times of the performed write-erase sequence exceeds second number of times of write-erase sequence, the memory cells are not used.

FIG. 12 is a flow chart of the operation of a ninth memory system according to a third embodiment.

The ninth memory system includes a memory cell for storing n-level data (n is an integer equal to or larger than 3 and is, for example, 3 or 4 or 8 or 16). As shown in FIG. 12, the ninth memory system has the structure such that the memory cells are operated as n-level memory cells when the number of times of performed write-erase sequence reaches the n-th number of write-erase sequence. After performing the n-th number of times of write-erase sequence, until the number of times of performed write-erase sequence reaches an (n−1)th number of times of write-erase sequence, the memory cells are operated as (n−1) level memory cells, as shown in FIG. 12. After performing an (i+1)-th number of times of write-erase sequence, until the number of times of performed write-erase sequence reaches an i-th number of times of write-erase sequence (i is an integer larger than 2), the memory cells are operated as i-level memory cells. Thereafter, when the number of times of performed write-erase sequence exceeds a second number of times of write-erase sequence, then the memory cells are not used.

FIG. 13 is a flow chart of the operation of a tenth memory system according to the third embodiment.

The tenth memory system includes memory cells for storing n-level data (n is an integer equal to or larger than 3 and is, for example, 3 or 4 or 8 or 16). As shown in FIG. 13, the tenth memory system has the memory cells which are operated as n-level memory cells until the number of times of performed write-erase sequence to the memory cell reaches an n-th number of times. After performing the n-th number of times of write-erase sequence, until the number of times of performed write-erase sequence reaches m-th number of times of write-erase sequence, the memory cells are operated as m (m is an integer smaller than n) level memory cells. If the number of the times of the performed write-erase sequence exceeds the m-th number of times of write-erase sequence, data is not written or erased to and from the memory cells.

FIG. 14 is a flow chart of the operation of an eleventh memory system according to the third embodiment.

The eleventh memory system includes memory cells for storing n-level data (n is an integer equal to or larger than 3 and is, for example, 3 or 4 or 8 or 16). The eleventh memory system has a structure such that the memory cells are operated as n-level memory cells until the number of performed write-erase sequence reaches the n-th number of times, as shown in FIG. 11. After performing the n-th number of times of write-erase sequence, until the number of times of performed write-erase sequence reaches a second number of times of write-erase sequence, the memory cells are operated as 2-level memory cells. If the number of times of the performed write-erase sequence exceeds second number of times of write-erase sequence, data in the memory cells is not erased and data is not written on the memory cells.

FIG. 15 is a flow chart of the operation of a twelfth memory system according to the third embodiment.

The twelfth memory system includes a memory cell for storing n-level data (n is an integer equal to or larger than 3 and is, for example, 3 or 4 or 8 or 16). As shown in FIG. 15, the ninth memory system has the structure such that the memory cells are operated as n-level memory cells when the number of times of performed write-erase sequence reaches the n-th number of write-erase sequence. After performing the n-th number of times of write-erase sequence, until the number of times of performed write-erase sequence reaches an (n−1)th number of times of write-erase sequence, the memory cells are operated as (n−1) level memory cells, as shown in FIG. 15. After performing an (i+1)-th number of times of write-erase sequence, until the number of times of performed write-erase sequence reaches an i-th number of times of write-erase sequence (i is an integer larger than 2), the memory cells are operated as i-level memory cells. Thereafter, when the number of times of performed write-erase sequence exceeds a second number of times of write-erase sequence, then data in the memory cells is not erased or data is not written on the same.

FIG. 16 is a flow chart of the operation of a thirteenth memory system according to the third embodiment.

The thirteenth memory system includes a memory cell for storing n-level data (n is an integer equal to or larger than 3 and is, for example, 3 or 4 or 8 or 16). As shown in FIG. 16, the thirteenth memory system has the structure such that the memory cells are operated as n-level memory cells when the number of times of performed write-erase sequence reaches the n-th number of write-erase sequence. After performing the n-th number of times of write-erase sequence, until the number of times of performed write-erase sequence reaches an (n−1)th number of times of write-erase sequence, the memory cells are operated as (n−1) level memory cells, as shown in FIG. 16. After performing an (i+1)-th number of times of write-erase sequence, until the number of times of performed write-erase sequence reaches an i-th number of times of write-erase sequence (i is an integer larger than 2), the memory cells are operated as i-level memory cells. Thereafter, until the number of times of performed write-erase sequence reaches a third number of times of write-erase sequence, the memory cells are operated as 3-level memory cells. After that, until the number of times of performed write-erase sequence reaches a second number of times of write-erase sequence, the memory cells are operated as 2-level memory cells. After the number of times of performed write-erase sequence has exceeded the second number of times of write-erase sequence, erase and writing of data to and from the memory cells may be inhibited or use of the memory cells may be inhibited.

A multi-level data NAND flash memory according to a fourth embodiment of the present invention will now be described.

The flash memory according to the fourth embodiment is structured such that the level at which the flash memory is operated is controlled by inputting a command from outside of the chip. A specific 4-level NAND flash memory is taken as an example to perform description.

The flash memory according to the present invention has internal operation modes including a 4-level writing and reading modes and 2-level writing and reading modes. Whether the 4-level writing or reading or 2-level writing or reading is performed is controlled with a command supplied from a controller on the outside of the chip.

The description will be performed about the writing mode and reading mode for 4-level data, and the writing mode and reading mode for 2-level data. Similarly to the conventional 2-level NAND flash memory, erase is performed in block units or chip units in both of the cases of the 4-level memory cell and the 2-level memory cell.

[1] In a case where the memory cell is operated as 4-level memory cell

FIG. 17 is a diagram showing the structure of a memory cell storage EEPROM according to the fourth embodiment of the present invention.

FIG. 17 shows the structure of the multi-level data storage EEPROM. The multi-level data storage EEPROM has a control-gate and selection-gate drive circuit 2 for selecting a memory cell from a memory cell array 1 having memory cells (not shown) disposed in a matrix configuration and applying writing voltage and reading voltage to a control gate. The control-gate and selection-gate drive circuit 2 is connected to an address buffer 5 to receive an address signal from the address buffer 5. A data circuit 3 is a circuit for maintaining write data and reading data in the memory cell. The data circuit 3 is connected to a data input/output buffer 4 to receive the address signal from the address buffer 5. A data input/output buffer 4 controls input/output of data to and from outside of the EEPROM.

FIG. 18 is a diagram showing the structures of the memory cell array 1 and the data memory cell 3.

As shown in FIG. 18, a NAND cell is formed by, in series, connecting memory cells M1 to M4. Two ends of the NAND cell respectively are connected to a bit line BIT LINE and a source line Vs through selection transistors S1 and S2. A group of memory cells M sharing a control gate, for example, CG1 forms a unit called a "page" so as to be simultaneously subjected to data writing and reading. A memory cell group connected to four control gates CG1 to CG4 forms a block. The "page" and "block" are selected by the control-gate and selection-gate drive circuit 2. Data circuits 3-0 to 3-m are connected to bit line BL0 for BLm, the data circuits being structured to temporarily storing write data onto the memory cells.

FIG. 19 is a graph showing the relationship between threshold voltages and four writing states (4-level data "0", "1", "2" and "3") when 4-level data is stored by providing four writing states for the memory cell M.

As shown in FIG. 19, state of data "0" is the same as a state where data has been erased and has, for example, a negative threshold value. State of data "1" has a threshold value of, for example, 0.5V to 0.8V, state of data "2" has a threshold value of, for example, 1.5V to 1.8V, and state of data "3" has a threshold value of, for example, 2.5V to 2.8V. Reading voltage VCG2R is applied to the control gate CG (any one of CG1 to CG4). Whether the memory cell is "ON" or "OFF" is used to detect whether data in the memory cell is "0" or "1" or whether the same is "2" or "3" can be detected. Then, reading voltages VCG3R and VCG1R are applied so that data in the memory cell is read. The reading voltages VCG1R, VCG2R and VCG3R respectively are made to be 0V, 1V and 2V. The voltages VCG1V, VCG2V and VCG3V are called verify voltages. When data is written, the verify voltages are applied to the control gate to detect the state of the memory cell M so as to determine whether or not writing has been performed sufficiently. The verify voltages VCG1V, VCG2V and VCG3V respectively are made to be 0.5V, 1.5V and 2.5V.

FIG. 20 is a circuit diagram of the memory cell of the memory cell array 1 and the data circuit 3 shown in FIG. 17.

As shown in FIG. 20, the data circuit 3 includes a first flip-flop FF1 and a second flip-flop FF2. The first flip-flop FF1 according to this embodiment is composed of n-channel MOS transistors Qn21, Qn22 and Qn23 and p-channel MOS transistors Qp9, Qp10 and Qp11 so that a so-called a cross coupling type latch circuit is formed. Also the second flip-flop FF2 is composed of n-channel MOS transistors Qn29, Qn30 and Qn31 and p-channel MOS transistors Qp16, Qp17 and Qp18 so that a so-called cross coupling type latch circuit is formed. Write/read data is latched in the flip-flops FF1 and FF2. Also the flip-flops FF1 and FF2 serve as sense amplifiers for amplifying the potential of the bit line BLa or the bit line BLb, that is, data. The flip-flops FF1 and FF2 latch, as write data information, data "0", data "1", data "2" and data "3". Moreover, the flip-flops FF1 and FF2 sense and latch, as read data information, data "0", data "1", data "2" and data "3" stored by the memory cell.

Data input/output lines IOA and IOB are connected to the first flip-flop FF1 through the corresponding n-channel MOS transistors Qn28 and Qn27. Data input/output lines IOC and IOD are connected to the second flip-flop FF2 through the n-channel MOS transistors Qn35 and Qn36. The data input/output lines IOA, IOB, IOC and IOD are as well as connected to the data input/output buffer 4 shown in FIG. 17.

Gates of the n-channel MOS transistors Qn27, Qn28, Qn35 and Qn36 are connected to an output of a column address decoder composed of a NAND logical circuit G2 and an inverter I4. The n-channel MOS transistors Qn26 and Qn34 respectively equalize the flip-flops FF1 and FF2 when signals ECH1 and ECH2 have been made to be "H" level. The n-channel MOS transistors Qn24 and Qn32 control the connection between the first flip-flop FF1 and a MOS capacitor Qd1 and the connection between the second flip-flop FF2 and a MOS capacitor Qd1. The n-channel MOS transistors Qn25 and Qn33 control the connection between the first flip-flop FF1 and the MOS capacitor Qd2 and the connection between the second flip-flop FF2 and the MOS capacitor Qd2.

A circuit composed of the p-channel MOS transistors Qp12C and Qp13C changes the gate voltage of the MOS transistor Qd1 in accordance with data in the flip-flop FF1 when activating signal VRFYBAC has been supplied. A circuit composed of the p-channel MOS transistor Qp14C and Qp15C changes the gate voltage of the MOS capacitor Qd2 in response to activating signal VRFYBBC and in accordance with data in the flip-flop FF1. A circuit composed of p-channel MOS transistors Qp12C, Qp19C and Qp20C changes the gate voltage of the MOS capacitor Qd1 in response to activating signal VRFYBA2C and in accordance with data in the flip-flops FF1 and FF2. A circuit composed of the p-channel MOS transistor Qp14C, Qp21C and Qp22C changes the gate voltage of the MOS capacitor Qd2 in response to activating signal VRFYBB2C and in accordance with data in the flip-flops FF1 and FF2.

A circuit composed of n-channel MOS transistors Qn1C and Qn2C changes the gate voltage of the MOS capacitor Qd1 in response to activating signal VRFYBA1C and in accordance with data in the flip-flop FF2. A circuit composed of the n-channel MOS transistors Qn3C and Qn4C changes the gate voltage of the MOS capacitor Qd2 in response to activating signal VRFYBB1C and in accordance with data in the flip-flop FF2.

Each of the MOS capacitors Qd1 and Qd2 comprises a depletion n-channel MOS transistor and has a capacity which is sufficiently smaller than the capacity of the bit line.

The n-channel MOS transistor Qn37 electrically charges the MOS capacitor Qd1 to voltage VA in response to signal PREA. The n-channel MOS transistor Qn38 electrically charges the MOS capacitor Qd2 to voltage VB in response to signal PREB. The n-channel MOS transistors Qn39 and Qn40 control the connection between the data circuit 3 and the bit lines BLa and that between the data circuit 3 and the bit line BLb. A circuit composed of the n-channel MOS transistors Qn37 and Qn38 also serves as a bit line voltage controller.

The operation of a flash memory (an EEPROM) having the data circuit 3 structured as shown in FIG. 20 will now be described with reference to a timing chart. In the following description, a state where control gate CG2A has been selected will now be described.

<Reading Operation>

Figure 21:
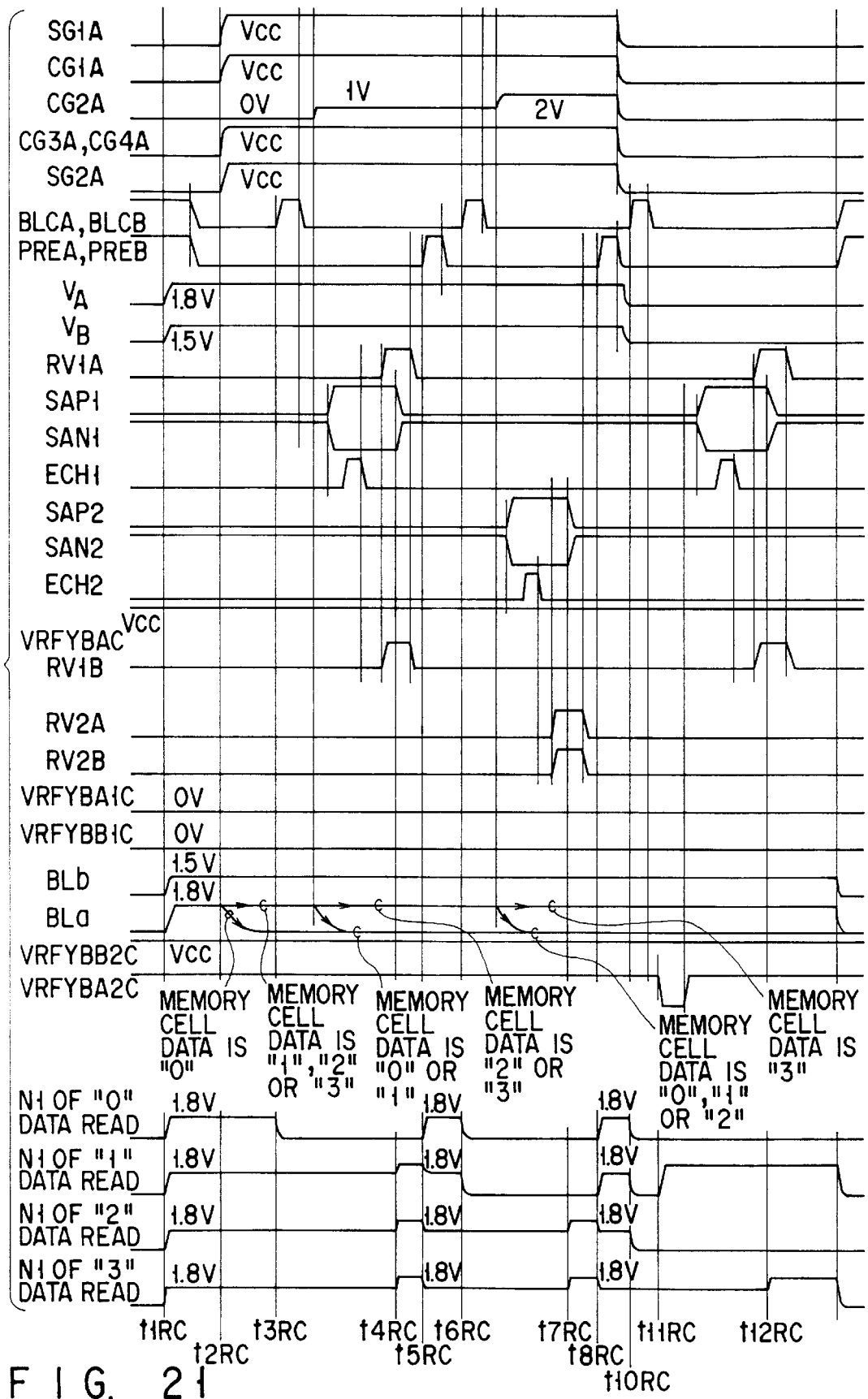
FIG. 21 is a timing chart of a reading operation.

FIG. 21 is a timing chart for a reading operation. Referring to FIG. 21, the reading operation will now be described.

As shown in FIG. 21, at time t1RC, voltages VA and VB respectively are made to be 1.8 v and 1.5 v so that bit lines BLa and BLb respectively are made to be 1.8V and 1.5V. When signals BLCA and BLCB are made to be "L" level, the bit line BLa and the MOS capacitor Qd1 are separated from each other and the bit line BLb and the MOS capacitor Qd2 are separated from each other. Moreover, the bit line BLa and BLb are brought to a floating state. When the signals PREA and PREB are made to be "L" level, the nodes N1 and N2 which are the gate electrodes of the MOS capacitors Qd1 and Qd2 are brought to a floating state.

At time t2RC, the selected control gate CG2A in a block selected by the control gate and selection gate driver 2 is made to be 0V, and the non-selected control gates CG1A, CG3A and CG4A and the selection gates SG1A and SG2A are made to be VCC. If the threshold value of the selected memory cell is 0V or lower, the bit line voltage is made to be lower than 1.5V. If the threshold value of the selected memory cell is 0V or higher, the bit line voltage is retained to be 1.8V.

Then, at time t3RC, the signals BLCA and BLCB are made to be "H" level so that data in the bit lines BLa and BLb is transferred to the MOS capacitors Qd1 and Qd2. Then, the signals BLCA and BLCB are again made to be "L" level so that the bit line BLa and the MOS capacitor Qd1 are separated from each other and the bit line BLb and the MOS capacitor Qd2 are separated from each other. Then signals SAN1 and SAP1 respectively are made to be "L" level and "H" level so that the flip-flop FF1 is deactivated. Then the signal ECH1 is made to be "H" level so that two input/output terminals (nodes N3C and N4C) of the first flip-flop FF1 are mutually equalize. Then, the signal RV1A and RV1B respectively are made to be "H".

At time t4RC, the signals SAN1 and SAP1 respectively are made to be "H" level and "L" level so that the voltage of the node N1 is sensed by the first flip-flop FF1 and then latched by the first flip-flop FF1. As a result, whether data in the memory cell is "0" or "1" or "2" or "3" is sensed by the flip-flop FF1 and information of this is latched. Then, the selected control gate CG2A is made to be 1V. If the threshold value of the selected memory cell is 1V or lower, the voltage of the bit line is made to be lower than 1.5V. If the threshold value of the selected memory cell is 1V or higher, the voltage of the bit line is retained to be 1.8V.

At time t5RC, the signals PREA and PREB are made to be "H" level so that the nodes N1 and N2 which are gate electrodes of the MOS capacitors Qd1 and Qd2 respectively are made to be 1.8V and 1.5V. When the signals PREA and PREB are made to be "L" level, the nodes N1 and N2 which are gate electrodes of the MOS capacitors Qd1 and Qd2 are brought to a floating state.

Then, at time t6RC, signals BLCA and BLCB respectively are made to be "H" level. The signals BLCA and BLCB are again made to be "L" level so that the bit line BLa and the MOS capacitor Qd1 are separated from each other and the bit line BLb and the MOS capacitor Qd2 are separated from each other. Then the signals SAN2 and SAP2 respectively are brought to "L" level and "H" level so that the second flip-flop FF2 is deactivated. Then signal ECH1 is made to be "H" level so that the two input/output terminals (the nodes N5C and N6C) are mutually equalized. Then, the signal RV2A and RV2B respectively are made to be "H" level.

At time t7RC, the signals SAN2 and SAP2 respectively are made to be "H" and "L" so that the voltage of the node N1 is sensed by the second flip-flop FF2 and latched by the control-gate and selection-gate drive circuit 2. As a result, whether data in the memory cell is "0" or "1" or "2" or "3" is sensed by the second flip-flop FF2 and information of this is latched. The relationship between the potentials of the nodes N3C and N5C of the flip-flops FF1 and FF2 is as shown in FIG. 22.

Finally whether or not data written on the memory cell is "2" or "3" is sensed. The selected control gate is made to be 2V. If the threshold value of the selected memory cell is 2V or lower, the voltage of the bit line is lower than 1.5V. If the threshold value of the selected memory cell is 2V or higher, the voltage of the bit line is retained to be 1.8V.

Then, at time t8RC, the signals PREA and PREB respectively are made to be "H" level so that the nodes N1 and N2 which are gate electrodes of the MOS capacitors Qd1 and Qd2 respectively are made to be 1.8V and 1.5V. When the signals PREA and PREB respectively are made to be "L" level, the nodes N1 and N2 which are gate electrodes of the MOS capacitors Qd1 and Qd2 are brought to a floating state.

At time t10RC, signals BLCA and BLCB respectively are made to be "H" level. Then, the signals BLCA and BLCB are again made to be "L" so that the bit line BLa and the MOS capacitor Qd1 are separated from each other and the bit line BLb and the MOS capacitor Qd2 are separated from each other.

Prior to sensing data in the MOS capacitor, VRFYBA2C is made to be 0V at time t11RC. As can be understood from FIG. 22, the node N5C is made to be "L (low)" level and the node N3C is made to be H (high) level (that is the node N4C is "L" level) only when data is "1". Therefore, only when data is "1", the p-channel MOS transistors Qp12C, Qp19C and Qp20C are turned on and the node N1 is made to be VCC. Then, the signals SAN1 and SAP1 respectively are made to be "L" level and "H" level so that the first flip-flop FF1 is deactivated and the ECH1 is made to be "H" level so as to be equalized. Then, the signals RV1A and RV1B respectively are made to be "H" level.

At time t12RC, the signals SAN1 and SAP1 respectively are made to be "H" level and "L" level. As a result, the voltage of the node N1 is sensed by the first flip-flop FF1 and then latched. Thus, whether data in the memory cell is "2" or "3" is sensed by the first flip-flop FF1 and information of this is latched.

As a result of the foregoing reading operation, four-level data is latched by the flip-flops FF1 and FF2, as shown in FIG. 23. Threshold values of data are distributed as follows:

data "0": threshold value is 0V or lower data "1": threshold value is 0.5V or higher and 0.8V or lower data "2": threshold value is 1.5V or higher and 1.8V or lower data "3": threshold value is 2.5V or higher and 2.8V or lower During the reading operation, both of the signals VRFY-BAC and VRFYBBC are "H" level. Both of the VRFYBA1C and VRFYBB1C are "L" level. Moreover, voltage Vs is made to be 0V.

When the column activating signal CENB to be supplied to the column address decoder is made to be "H" level, data stored in the data circuit 3 selected by the address signal is output to the data input/output lines IOA, IOB, IOC and IOD so as to be output to the outside of the EEPROM through the data input/output buffer 4.

The relationship among data stored in the memory cell, threshold values and levels to be output to the data input/output lines IOA, IOB, IOC and IOD after reading is as shown in FIG. 23.

Data to be output to the outside of the chip may be data obtained by performing conversion on the basis of signals output to the data input/output lines IOA, IOB, IOC and IOD in the data input/output buffer 4.

<Writing Operation>

Initially, write data is loaded into the flip-flops FF1 and FF2. Then, data "1", data "2" and data "3" simultaneously are written on the memory cell. Then, verify read is performed to verify whether or not data "1", data "2" and data "3" have been written sufficiently. If a memory cell on which data has not been written sufficiently exists, writing is again performed. Sufficient writing of data on all of the memory cells is detected by the write completion detection circuit and thus writing is completed.

The program will now be described, and then verify read will be then described.

(1) Program

Prior to performing the writing operation, supplied data for two bits is converted by the data input/output buffer 4 so as to be supplied to the data circuit 3. The relationship between 4-level data and data input/output lines IOA, IOB, IOC and IOD is as shown in FIG. 24.

Converted 4-level data is transferred to a data circuit 3 at a column address instructed with the address signal when the column activating signal CENB is "H" level.

Figure 25:
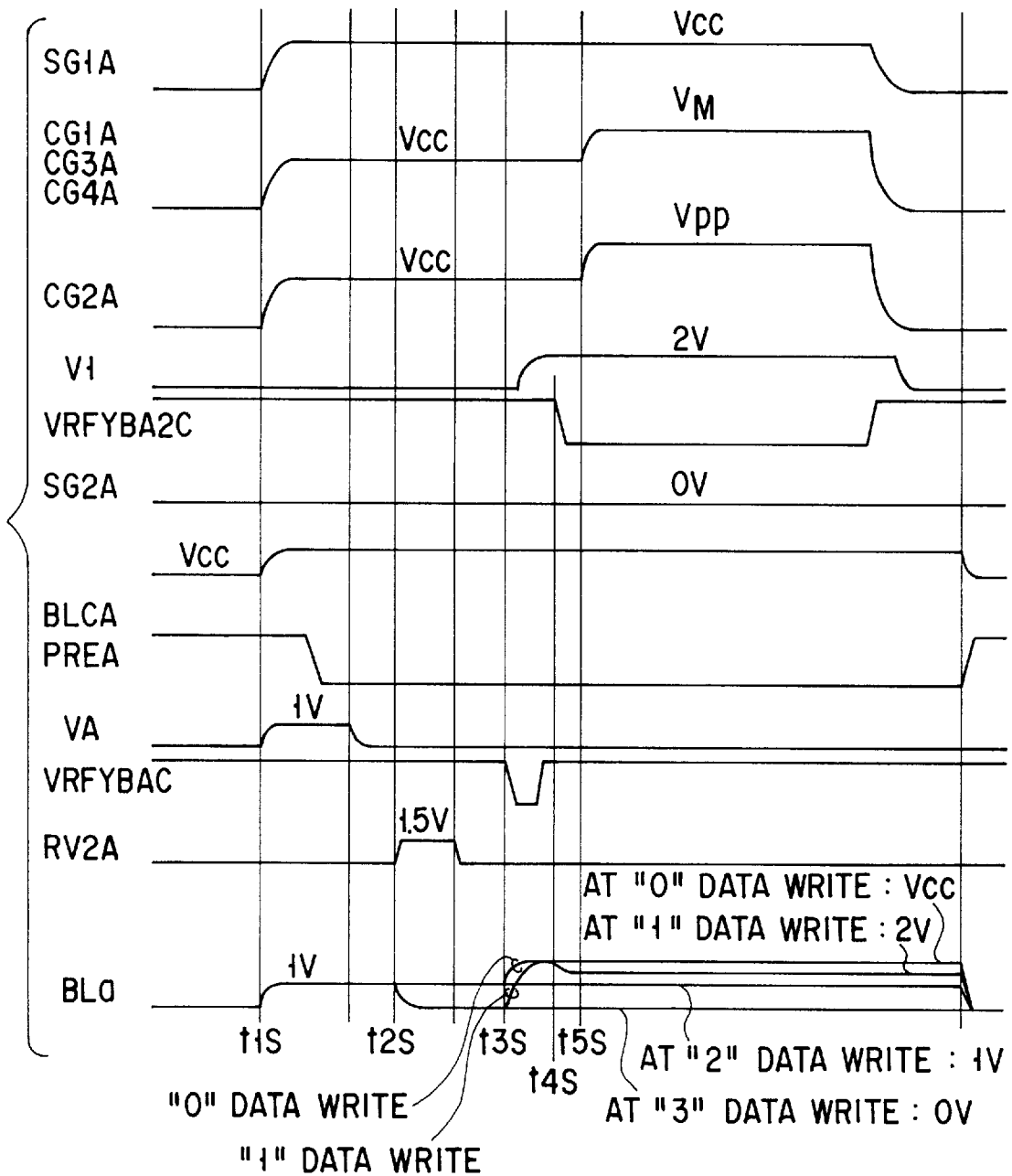
FIG. 25 is a timing chart of a writing operation.

FIG. 25 is a timing chart for the writing operation. Referring to FIG. 25, the writing operation will now be described.

As shown in FIG. 25, at time t1S, voltage VA is made to be the bit line writing control voltage 1V so that the bit line BLa is made to be 1V. When voltage drop of the n-channel MOS transistor Qn39 corresponding to the threshold value raises a problem, the level of the signal BLCA is required to be raised. Then, the signal PREA is made to be "L" level so that the bit line BLa is brought to a floating state.

At time t2S, the signal RV2A is made to be 1.5V. As a result, bit line write control voltage of 0V is applied to the bit line BLa from a data circuit storing data "1" or "3". When the threshold value of the n-channel MOS transistor Qn32 is made to be 1V, the n-channel MOS transistor Qn32 is turned off when "0" or "2" is written. When "1" or "3" is written, the n-channel MOS transistor Qn32 is turned on.

Then, VRFYBAC is made to be 0V at time t3S, and bit line write control voltage VCC is output from a data circuit having data "0" to the bit line BLa.

At time t4S, signal VRFYBA2C is made to be 0V so that write portion 2V for data "1" is output from the data circuit storing data "1" to the bit line BLA through a terminal V1.

As a result, bit lines for writing "0" are made to be VCC, bit lines for writing "1" are made to be 2V, bit lines for writing data "2" are made to be 1V and bit lines for writing data "3" are made to be 0V. During time t1S to t4S, selection gate SG1A and control gates CG1A to CG4A of the block selected by the election gate/selection gate driver 2 are made to be VCC. The selection gate SG2A is made to be 0V.

Then, the selected control gate CG2A is, at time t5s, made to be high voltage of VPP (for example, 20V), while the non-selected control gates CG1A, CG3A and CG4A are made to be voltage VM (for example, 10V). In the memory cell corresponding to a data circuit saving data "3", the difference in the potential between the channel potential of 0V and VPP of the control gate causes electrons to be injected into the floating gate so that the threshold value of the memory cell is enlarged. In the memory cell corresponding to the data circuit saving data "2", the difference in the potential between the channel potential of 1V and VPP of the control gate causes electrons to be injected into the floating gate so that the threshold value is enlarged. In the memory cell corresponding to the data circuit saving data "1", the difference in the potential between the channel potential of 2V and VPP of the control gate causes electrons to be injected into the floating gate so that the threshold value is enlarged. The reason why the channel potential when data $2k$ is written is made to be 1V and the channel potential when data "1" is written is made to be 2V is that the quantity of electrons to be injected are attempted to be reduced in a sequential order as the case where data "3" is written, the case where data "2" is written and the case where data "1" is written. In the memory cell corresponding to the data circuit saving data "0", the difference in the potential between the channel potential and VPP of the control gate is small. Therefore, substantially no electrons are injected into the floating gate. Therefore, the threshold value of the memory cell is not changed. During the writing operation, signals SAN1, SAN2, PREB and BLCB are "H" level, the signals SAP1, SAP2, VRFYBA1C, RV1A, RV1B, RV2B, ECH1 and ECH2 are "L" level and the voltage VB is 0V.

(2) Verify Read

After the writing operation has been performed, whether or not writing has been performed sufficiently is detected (write verify). If a required threshold value has been realized, data in the data circuit is changed to "0". If the required threshold value has not been realized, data in the data circuit is maintained and the writing operation is again performed. The writing operation and the write verify are repeated until all of the memory cells on which data "1" is written, the memory cells on which data "2" is written and the memory cells on which data "3" is written reach required threshold values.

Figure 26:
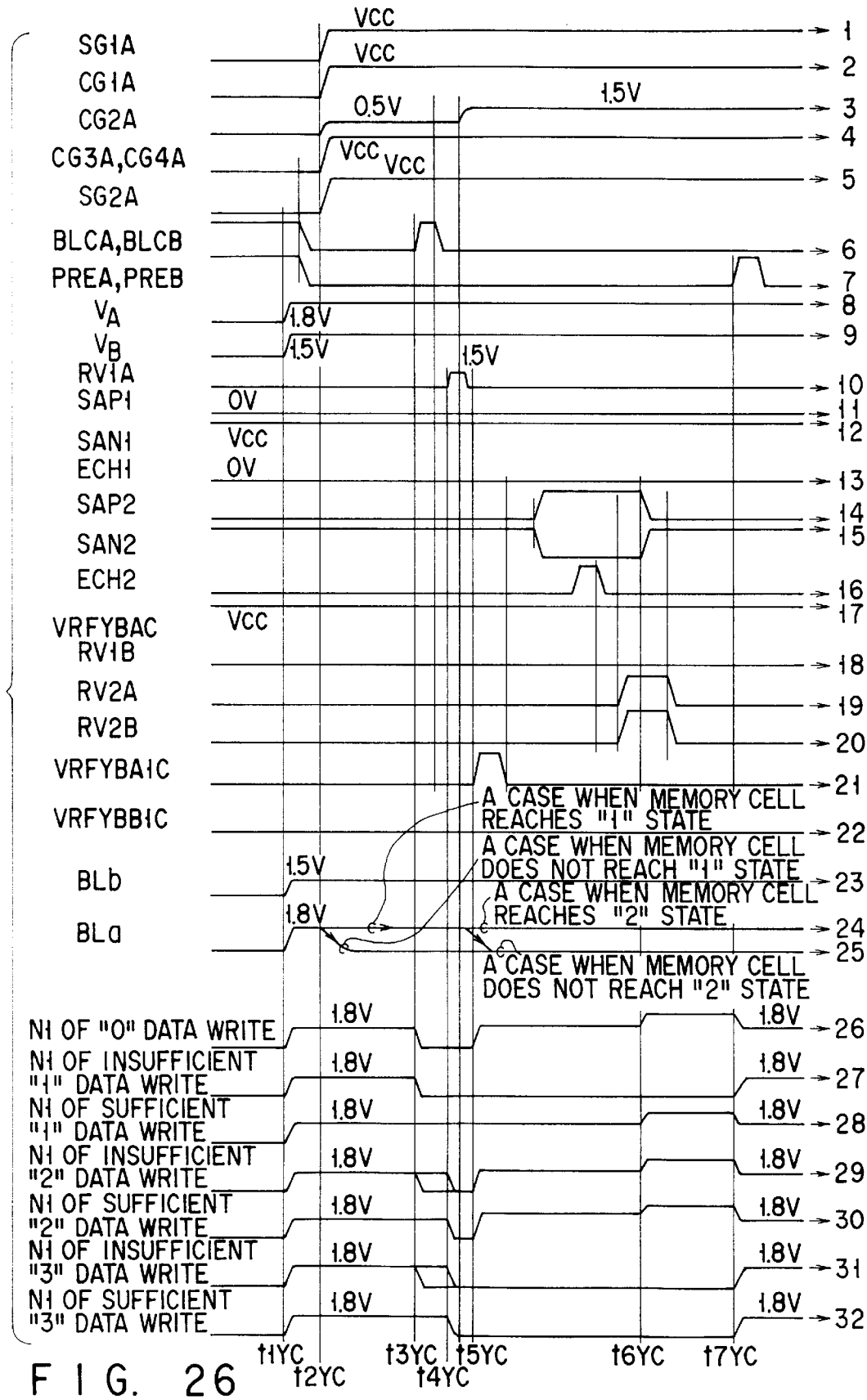
FIG. 26 is a timing chart of a write verify operation.
Figure 27:
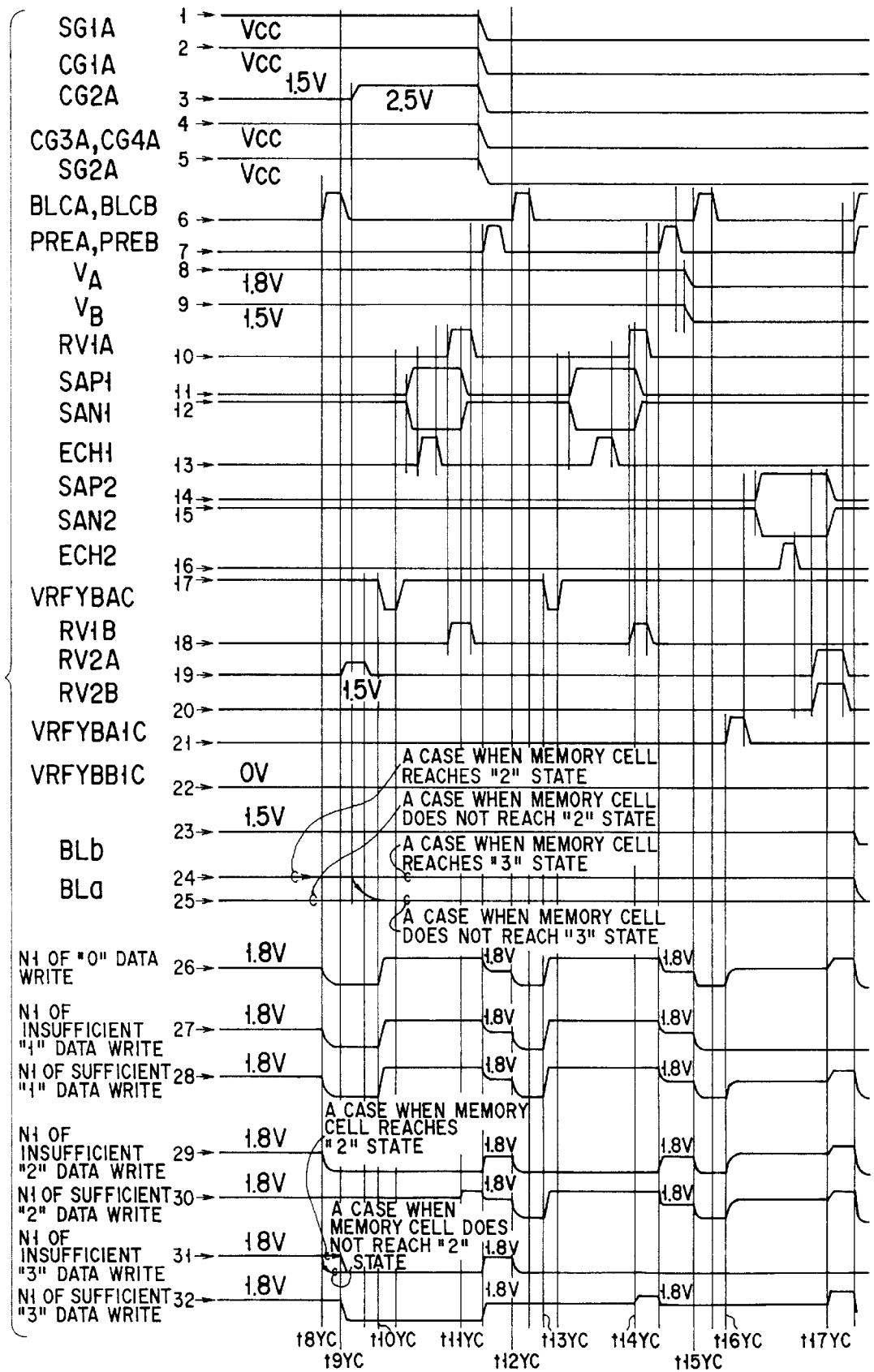
FIG. 27 is a timing chart of a write verify operation.
Figure 39A:
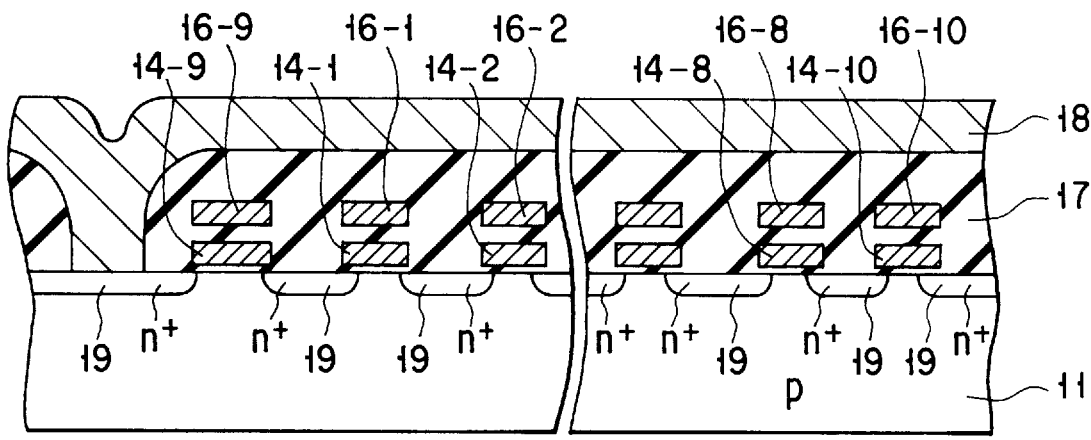
FIG. 39A is a cross sectional view taken along line XXXIXA—XXXIXA shown in FIG. 38A.
Figure 39B:
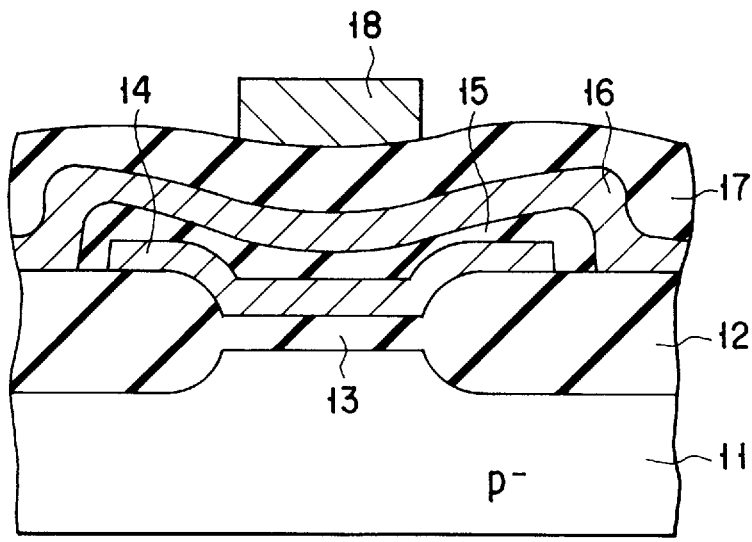
FIG. 39B is a cross sectional view taken along line XXXIXB—XXXIXB shown in FIG. 38A.
Figure 40:
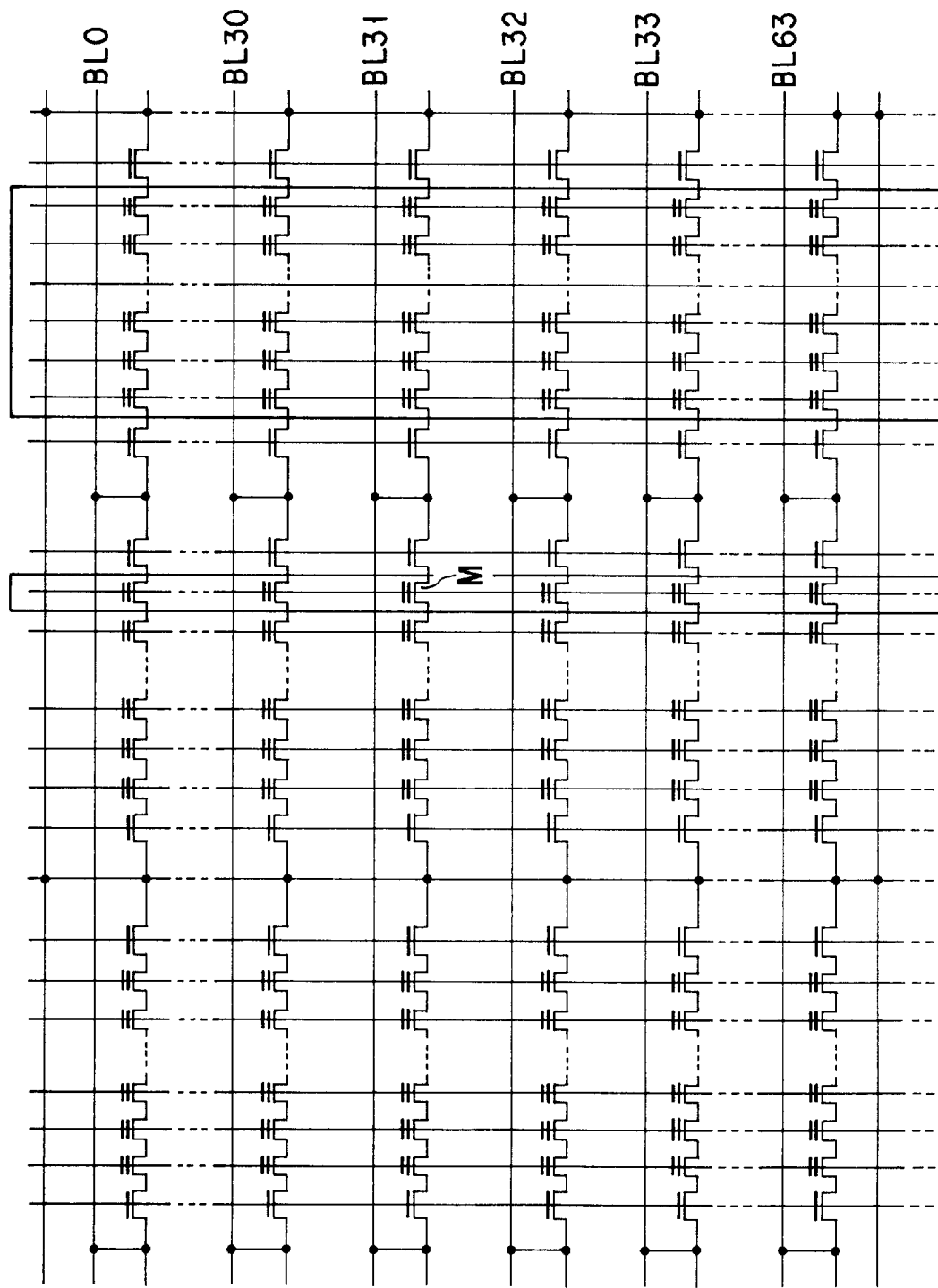
FIG. 40 is a circuit diagram showing a memory cell array having NAND cells disposed in a matrix configuration.

FIGS. 26 and 27 respectively are timing charts for the write verify operation. Although FIGS. 26 and 27 are in the form of sectioned figures because of the size, FIGS. 26 and 27 are continuous figures in terms of time. Referring to FIG. 26, numerals 1 to 32 given to the right-hand ends of the signal waveforms shown in FIG. 26 indicate continuation to numerals 1 to 32 given to the left-hand ends of the signal waveforms shown in FIG. 27. Referring to FIGS. 26 and 27, the write verify operation will now be described.

Initially, whether or not the memory cell, on which data "1" is written, has reached a predetermined threshold value is detected.

As shown in FIG. 26, at time t1YC, voltage VA and VB respectively are made to be 1.8 v and 1.5 v so that bit lines BLa and BLb respectively are made to be 1.8V and 1.5V. When signals BLCA and BLCB are made to be "L" level, the bit line BLa and the MOS capacitor Qd1 are separated from each other and the bit line BLb and the MOS capacitor Qd2 are separated from each other. Moreover, the bit line BLa and BLb are brought to a floating state. When the signals PREA and PREB are made to be "L" level, the nodes N1 and N2 which are the gate electrodes of the MOS capacitors Qd1 and Qd2 are brought to a floating state.

At time t2YC, the selected control gate CG2A in a block selected by the control gate and selection gate driver 2 is made to be 0.5V, and the non-selected control gates CG1A, CG3A and CG4A and the selection gates SG1A and SG2A are made to be VCC. If the threshold value of the selected memory cell is 0.5V or lower, the bit line voltage is made to be lower than 1.5V. If the threshold value of the selected memory cell is 0.5V or higher, the bit line voltage is retained to be 1.8V.

Then, at time t3YC, the signals BLCA and BLCB are made to be "H" level so that the potential of the bit line is transferred to the nodes N1 and node N2. Then, the signals BLCA and BLCB are made to be "L" level so that the bit line BLa and the MOS capacitor Qd1 are separated from each other and the bit line BLb and the MOS capacitor Qd2 are separated from each other.

Then, the signal RV1A is made to be 1.5V at time t4YC, the node N1 is electrically discharged to 0V when data "2" is written or data "3" is written.

When the signal VRFYBA1C has been made to be "H" level at time t5YC, the n-channel MOS transistor Qn2 of the data circuit storing write data "0" or "2" is turned on and the node N1 is made to be VCC. As a result, the node N1 is made to be VCC when data "0" is written or data "2" is written and made to be 0V when data "3" is written. Then, the signals SAN2 and SAP2 respectively are made to be "L" level and "H" level so that the second flip-flop FF2 is deactivated and the ECH2 is made to be "H". Thus, the two input/output terminals (nodes N5C and N6C) of the control-gate and selection-gate drive circuit 2 are mutually equalized. Then, the signals RV2A and RV2B respectively are made to be "H" level.

At time t6YC, the signals SAN2 and SAP2 respectively are again made to be "H" level and "L" level so that the voltage of the node N1 is sensed and latched. As a result, whether or not data in the memory cell corresponding to only the data circuit saving write data "1" has been sufficiently brought to the state for writing data "1" is detected. If data in the memory cell is "1", the voltage of the node N1 is sensed and latched by the flip-flop FF2 so that write data is changed to "0". If data in the memory cell is not "1", the flip-flop FF1 senses and latches the voltage of the node N2 to retain the write data to be "1". Data to be written on the data circuit saving "0" or "2" or "3" is not changed. Note that the selected control gate is made to be 1.5V. If the threshold value of the selected memory cell is 1.5V or lower, the bit line voltage is made to be lower than 1.5V. If the threshold value of the selected memory cell is 1.5V or higher, the bit line voltage is retained to be 1.8V.

At time t7YC, signals PREA and PREB respectively are made to be VCC so that the nodes N1 and N2 respectively are made to be 1.8V and 1.5. Then, the nodes N1 and N2 are brought to the floating gate state.

Then, the signals BLCA and BLCB are made to be "H" level at time t8YC as shown in FIG. 27 so that the potential of the bit line is transferred to the nodes N1 and node N2. Then, the signals BLCA and BLCB are made to be "L" so that the bit line BLa and the MOS capacitor Qd1 are separated from each other and the bit line BLb and the MOS capacitor Qd2 are separated from each other.

At time t9YC, the signal RV2A is made to be VCC or lower, for example, 1.5V. If the threshold value of the n-channel MOS transistor Qn32 is 1V, the n-channel MOS transistor Qn32 of the data circuit saving write data "3" is turned on and the node N1 is made to be 0V. If data "2" has been sufficiently written on the memory cell of the data circuit saving write data of "2", the n-channel MOS transistor Qn32 is turned off so that the node N1 is retained to be 1.5V or higher. If data "2" has not been written sufficiently, the node N1 is 1.5V or lower.

When the VRFYBAC is made to be "L" at time t10YC, the p-channel MOS transistor Qp13 of the data circuit saving write data "0" or "1" is turned on so that the node N1 is made to be VCC. The signals SAN1 and SAP1 respectively are made to be "L" level and "H" level so that the first flip-flop FF1 is deactivated and the ECH1 is made to be "H" level. Thus, the two input/output terminals (the nodes N3C and N4C) are mutually equalized. Then, the signals RV1A and RV1B respectively are made to be "H" level.

When the signals SAN1 and SAP1 respectively are, at time t11YC, again made to be "H" level and "L" level, the voltage of the node N1 is sensed and latched. Whether or not data in the memory cell corresponding to only the data circuit saving write data "2" has been sufficiently brought to the state for writing "2" is detected. If data in the memory cell is "2", the voltage of the node N1 is sensed and latched by the flip-flop FF1 so that write data is changed to "0". If data in the memory cell is not "2", the voltage of the node N1 is sensed and latched by the flip-flop FF1 so that write data "2" is retained. Write data in the data circuit saving write data "0" or "1" or "3" is not changed. Note that the selected control gate is made to be 2.5V. If the threshold value of the selected memory cell is 2.5V or lower, the bit line voltage is made to be lower that 1.5V. If the threshold value of the selected memory cell is 2.5V or higher, the bit line voltage is retained to be 1.8V.

At time t12YC, signals BLCA and BLCB are made to be "H" level so that the potential of the bit line is transferred to the nodes N1 and node N2. When the signals BLCA and BLCB are again made to be "L" level, the bit line BLa and the MOS capacitor Qd1 are separated from each other and the bit line BLb and the MOS capacitor Qd2 are separated from each other.

At time t13YC, the VRFYBAC is made to be "L" level so that the p-channel MOS transistor Qp13c of the data circuit saving write data "0" or "1" or the data circuit on which "2" has been written sufficiently is turned on so that the node N1 is made to be VCC. When the signals SAN1 and SAP1 respectively are made to be "L" level and "H" level so that the flip-flop FF1 is deactivated and the signal ECH1 is made to be "H" level. Thus, the two input/output terminals (the nodes N3C and N4C) of the first flip-flop FF1 are mutually equalized. Then, the signals RV1A and RV1B are made to be "H" level.

At time t14YC, the signals SAN1 and SAP1 respectively are made to be "H" level and "L" level so that the voltage of the node N1 is sensed and latched. Then, write data is converted, as shown in FIG. 27.

At time t15YC, both of the signals BLCA and BLCB are made to be "H" level so that the portion of the bit line is transferred to the nodes N1 and N2. The signals BLCA and BLCB are again made to be "L" level so that the bit line BLa and the MOS capacitor Qd1 are separated from each other and the bit line BLb and the MOS capacitor Qd2 are separated from each other.

At time t16YC, the VRFYBA1C is made to be "H" level so that the n-channel MOS transistor Qn2C of the data circuit saving write data "0" or "2" and the data circuit on which "1" has been written sufficiently is turned on so that the node N1 is made to be VCC. The signals SAN2 and SAP2 respectively are made to be "L" level and "H" level so that the flip-flop FF2 is deactivated and the signal ECH2 is made to be "H" level. Thus, the two input/output terminals (the nodes N5C and N6C) of the second flip-flop FF2 are mutually equalized. Then, the signal RV2A and RV2B are made to be "H" level.

At time t17YC, the signals SAN2 and SAP2 respectively are made to be "H" level and "L" level so that the voltage of the node N1 is sensed and latched. In this embodiment, the VRFYBA1C is made to be VCC at time t16YC to electrically charge the node N1 of the MOS capacitor Qd1 to be higher than the potential (1.5V) of the node N2 when "0" is written and when "2" is written. A structure may be employed in which RV2B is made to be, for example, 1.5V at time t16YC. In a case where "0" or "2" is written, the n-channel MOS transistor Qn33 is turned on because the node N6C is 0V. Therefore, the node N2 is made to be 0V. If "1" or "3" is written, the n-channel MOS transistor Qn33 is turned is because the node N6C is VCC and the node N2 is 1.5V so that the node N2 maintains 1.5V. At time t16YC, VRFYBA1C is made to be VCC to perform the foregoing operation. Since the level to which the node N1 must be electrically charged when "0" is written or "2" is written is required to be higher than the potential (0V) of the node N2, the node N1 is required to be electrically charged to a low level of, for example, about 0.5V.

As described above, data in the memory cell corresponding to only the data circuit saving write data of "3" has been sufficiently brought to the state for writing "3" is detected. If data in the memory cell is "3", the flip-flops FF1 and FF2 sense and latch the voltage of the node N1 so that write data is changed to "0". If data in the memory cell is not "3", the flip-flops FF1 and FF2 sense and latch the voltage of the node N1 so that the write data of "3" is retained. Write data in the data circuit saving write data "0" or "1" or "2" is not changed.

During the write verify, the signal VRFYBBC is made to be "H", the signal VRFYBB1C is made to be "L" and the voltage Vs is made to be 0V.

If all of the selected memory cells have reached required threshold values, data in the data circuit is made to be "0". That is, when writing has been completed, the nodes N4C and N6C are made to be "L" level. By detecting this, whether or not all of the selected memory cell have reached required threshold values can be detected. Detection of completion of writing may be performed by, for example, a write completion collectively detecting transistor Qn8C and the write completion collectively detecting transistor Qn6C having a gate connected to the node N6C shown in FIG. 20.

After verify read has been performed, the terminal VRTC is precharged to, for example, VCC. If one or more memory cells on which data has been written insufficiently exists, at least either the node N4C or the node N6C of the data circuit is "H" level. Therefore, at least either the n-channel MOS transistor Qn5C or the n-channel MOS transistor Qn6C is turned on so that the level of the terminal VRTC is lowered from the precharge level. When data has been written sufficiently on all of the memory cells, the nodes N4C and N6C of the data circuits 3-0, 3-1, . . . , 3-m−1 and 3-m are made to be "L" level. As a result, the N-channel MOS transistors Qn5C and Qn6C in all of the data circuits are turned off so that the potential of the terminal VRTC maintains the precharge potential.

[2] In a case memory cell acts as 2-level memory cell

The writing and reading procedures when the memory cell acts as a 2-level data memory cell will now be described. A circuit for controlling write data is, similarly to the case where the memory cell acts as the 4-level data memory cell, the circuit shown in FIG. 20.

<Writing Operation>

Data supplied before the writing operation is performed is supplied to the data circuit 3 through the data input/output buffer 4. Data is supplied to the first flip-flop FF1 through IOA and IOB when the column activating signal CENB is "H" level.

FIG. 28 is a graph showing the relationship between the threshold voltages and two write states (2-level data "0" and "1") when 2-level data is stored by providing two writing states for the memory cell M. FIG. 29 is a table showing the relationship between write data and nods N3C and N4C of the first flip-flop FF1. FIG. 30 is a timing chart for the writing operation. Referring to FIG. 30, the writing operation will now be described.

As shown in FIG. 30, time t1S, the signal VRFYBAC is made to be 0V so that bit line write control voltage VCC is output to the bit line BLa from the data circuit storing data "0".

At time t2S, the signal RV1A is made to be VCC so that voltage 0V is output to the bit line from the data circuit storing data "1".

As a result, the bit line for writing data "0" is made to be VCC and the bit line for writing data "1" is made to be 0V. At time t1S, the selection gate SG1A and the control gates CG1A to CG4A in the blocks selected by the control-gate and selection-gate drive circuit 2 are made to be VCC. Note that the selection gate SG2A is 0V.

At time t3S, the selected control gate CG2A is, at time t3S, made to be high voltage of VPP (for example, 20V), while the non-selected control gates CG1A, CG3A and CG4A are made to be voltage VM (for example, 10V). In the memory cell corresponding to a data circuit saving data "1", the difference in the potential between the channel potential of 0V and VPP of the control gate causes electrons to be injected into the floating gate so that the threshold value of the memory cell is enlarged. In the memory cell corresponding to the data circuit saving data "0", the selection gate SG1A is turned off. Therefore, the channel of the memory cell is brought to the floating state. As a result, the potential of the channel of the memory cell is, by the capacity coupling between the channel and the control gate, made to be about 8V. Since the channel is 8V and the control gate is 20V in the memory cell on which data "0" is written, no electron is injected into the memory cell and the erase state ("0") is maintained. During the writing operation, the signals SAN1, SAN2, PREB, BLCB and VRFYBA2C are "H" level, signals SAP1, SAP2, VRFYBA1C, RV1B, RV2B, ECH1 and ECH2 are "L" level, and the voltage VB is 0V.

(2) Verify Read

After the writing operation has been performed, whether or not writing has been performed sufficiently is detected (that is, write verify is performed). If a required threshold value has been realized, data in the data circuit is changed to "0". If the required threshold value has not been realized, data in the data circuit is maintained and the writing operation is again performed. The writing operation and the write verify are repeated until all of the memory cells on which data "1" is written reach a required threshold value.

FIG. 31 is a timing chart for the write verify operation.

Referring to a circuit diagram shown in FIG. 20 and the timing chart shown in FIG. 31, the write verify operation will now be described.

As shown in FIG. 31, at time t1YC, voltage VA and VB respectively are made to be 1.8 v and 1.5 v so that bit lines BLa and BLb respectively are made to be 1.8V and 1.5V.

When signals BLCA and BLCB are made to be "L" level, the bit line BLa and the MOS capacitor Qd1 are separated from each other and the bit line BLb and the MOS capacitor Qd2 are separated from each other. Moreover, the bit line BLa and BLb are brought to a floating state. When the signals PREA and PREB are made to be "L" level, the nodes N1 and N2 which are the gate electrodes of the MOS capacitors Qd1 and Qd2 are brought to a floating state.

At time t2YC, the selected control gate CG2A in a block selected by the control gate and selection gate driver 2 is made to be 0.5V, and the non-selected control gates CG1A, CG3A and CG4A and the selection gates SG1A and SG2A are made to be VCC. If the threshold value of the selected memory cell is 0.5V or lower, the bit line voltage is made to be lower than 1.5V. If the threshold value of the selected memory cell is 0.5V or higher, the bit line voltage is retained to be 1.8V.

Then, at time t3YC, the signals BLCA and BLCB are made to be "H" level so that the potential of the bit line is transferred to the nodes N1 and node N2. Then, the signals BLCA and BLCB are made to be "L" level so that the bit line BLa and the MOS capacitor Qd1 are separated from each other and the bit line BLb and the MOS capacitor Qd2 are separated from each other.

When the signal VRFYBAC has been made to be "L" level at time t4YC, the p-channel MOS transistor Qp12C in the data circuit storing write data "0" is turned on and the node N1 is made to be VCC. As a result, the node N1 is made to be VCC when data "0" is written. When data "1" is written, the p-channel MOS transistor Qp12C is turned off. That is, if data "1" has been written sufficiently, the node N1 is made to be VCC. If data "1" has not been written sufficiently, the node N1 is made to be 0V. Then, the signals SAN1 and SAP1 respectively are made to be "L" level and "H" level so that the first flip-flop FF1 is deactivated and ECH1 is made to be "H" level. Thus, the two input/output terminals (the nodes N3C and N4C) of the first flip-flop FF1 are mutually equalized. Then, the signals RV1A and RV1B are made to be "H" level.

At time t5YC, the signals SAN2 and SAP2 respectively are again made to be "H" level and "L" level so that the voltage of the node N1 is sensed and latched. As a result, whether or not data in the memory cell corresponding to only the data circuit saving write data "1" has been sufficiently brought to the state for writing data "1" is detected. If data in the memory cell is "1", the voltage of the node N1 is sensed and latched by the flip-flop FF1 so that write data is changed to "0". If data in the memory cell is not "1", the flip-flop FF1 senses and latches the voltage of the node N1 to retain the write data to be "1". Data to be written on the data circuit saving "0" is not changed.

If all of the selected memory cells have reached required threshold values, the node N4C of the data circuit is made to be "L". By detecting this, whether or not all of the selected memory cell have reached required threshold values can be detected. Detection of completion of writing may be performed by the write completion collectively detecting transistor Qn5c having the gate connected to the node N4C shown in FIG. 20.

After verify read has been performed, the terminal VRTC is precharged to, for example, VCC. If one or more memory cell on which data has not been written sufficiently exists, the node N4C of the subject data circuit is made to be "H". Therefore, the n-channel MOS transistor Qn5C is turned on so that the potential of the terminal VRTC is lowered from the precharge potential. When data has been written on all of the memory cells, all of the nodes N4C of the data circuits 3-0, 3-1, . . . , 3-m–1 and 3-m are made to be "L" level. As a result, the n-channel MOS transistors Qn5C in all of the data circuits are turned off. Therefore, the potential of the terminal VRTC maintains the precharge level and thus completion of writing is detected.

<Reading Operation>

In the reading operation, whether "0" or "1" is read.

FIG. 32 is a timing chart for the reading operation. Referring to FIG. 32, the reading operation will now be described.

As shown in FIG. 32, the voltages VB and VB are, at time t1RD, respectively are made to be 1.8V and 1.5V so that the potentials of the bit lines BLa and BLb are made to be 1.8V and 1.5V, respectively. Moreover, the signals BLCA and BLCB respectively are made to be "L" level so that the bit line BLa and the MOS capacitor Qd1 are separated from each other and the bit line BLb and the MOS capacitor Qd2 are separated from each other. Thus, the bit lines BLa and BLb are brought to a floating state. When signals PREA and PREB have been made to be "L" level, the nodes N1 and N2 which are gate electrodes of the MOS capacitors Qd1 and Qd2 are brought to a floating state.

Then, the selected control gate CG2A in the block selected by the control-gate and selection-gate drive circuit 2 is made to be 0V, the non-selected control gates CG1A, CG3A and the CG4A and the selected gates SG1A and SG2A are made to be VCC. If the threshold value of the selected memory cell is 0V or lower, the voltage of the bit line is lower than 1.5V. If the threshold value of the selected memory cell is 0V or higher, the voltage of the bit line is retained to be 1.8V.

At time t2RD, the signals BLCA and BLCA respectively are made to be "H" level so that data on the bit line is transferred to the MOS capacitors Qd1 and Qd2. Then, the signals BLCA and BLCB are again made to be "L" so that the bit line BLa and the MOS capacitor Qd1 are separated from each other and the bit line BLb and the MOS capacitor Qd2 are separated from each other. Moreover, the signals SAN1 and SAP1 respectively are made to be "L" level and "H" level so that the first flip-flop FF1 is deactivated and the signal ECH1 is made to be "H". Thus, the two input/output terminals (the nodes N3C and N4C) of the first flip-flop FF1 are mutually equalized. Then, the signals RV1A and RV1B respectively are made to be "H" level.

At time t3RD, the signals SAN1 and SAP1 respectively are made to be "H" level and "L" level so that the voltage of the node N1 is sensed by the first flip-flop FF1 and then latched by the first flip-flop FF1. As a result, whether data in the memory cell is "0" or "1" is sensed by the first flip-flop FF1 and information of this is latched.

A memory system according to a fifth embodiment of the present invention will now be described.

The memory systems according to the first to fourth embodiments have the structure such that the performance (the level at which the same is operated) of the memory cell is determined by monitoring the number of write-erase sequence of the memory cell or by monitoring the time for which the memory cell is used. The monitoring method is not limited to the foregoing methods.

The memory system according to the fifth embodiment is significantly effective to determine the switch of the performance of the memory cell. Another monitoring method and a memory system having the monitoring method will now be described.

FIG. 33 is a flow chart showing the operation of a first memory system according to the fifth embodiment.

As shown in FIG. 33, the first memory system is structured such that the number of write verifications, that is, the number of times of write-verify read is monitored. As a matter of course, the number of times of erase verifications may be monitored in place of monitoring the number of times of the write verifications.

That is, the NAND EEPROM has a structure such that program pulses are applied and then verify read is performed to examine whether or not write or erase has been performed sufficiently when writing or erasing is performed. If a memory cell on which data has been rewritten sufficiently or from which data has been erased sufficiently exists, writing or erasing is again performed. An assumption is made here that the memory cell has been rewritten sufficiently as a result of the three times of verify read cycles when the memory cell has been used first. As the number of times of write-erase sequence increases, electrons are trapped by the tunnel oxide film of the memory cell and writing cannot easily be performed. As a result, the number of write and verify read cycles increases to four, five and six. Therefore, a structure may be employed in which the memory cell is operated as a 4-level memory cell when the number of write-verify read cycles is smaller than a predetermined number (for example, five), as shown in FIG. 1. When writing is performed after the number of the cycles has exceeded the predetermined number of times, the memory cell is operated as a 3-level memory cell. Also in the case where the memory cell is operated as the 3-level memory cell, the number of the write-verify read cycles increases as the number of times of write-erase sequence increases. Therefore, the memory cell may be operated as a 2-level memory cell after the number of times has reached a predetermined number of times (for example, seven, or five or four). If the number of write-verify read cycles as the 2-level memory cell has reached a predetermined number of times, use of the memory cell may be inhibited or writing or erasing of data may be inhibited.

As described above, the number of write-verify read cycles is detected and the degree of deterioration of the memory cell can be recognized in accordance with a result of the detection. Therefore, whether or not the number of write-verify read cycles has reached a predetermined number of times is determined so that the number of information items which are stored in the memory cells is changed as can be performed in the first to fourth embodiments. The foregoing monitoring method may be adapted to the memory systems according to the first to fourth embodiments or a multi-level data storage flash memory.

For example, the memory cell may first be used as, for example, a 4-level data memory cell, and after the number of performed write-verify read cycles has reached a predetermined number of times in the 4-level data memory cell mode, then the memory cell may be used as a 2-level data memory cell.

The monitoring method adapted to the memory system according to the fifth embodiment may effectively be employed by a 2-level memory cell, as well as the multi-level data memory cell.

FIG. 34 is a flow chart of the operation of a second memory system according to the fifth embodiment.

As shown in FIG. 34, the memory cell is used as a 2-level memory cell until the number of write-verify read cycles reaches a predetermined number of times. If the number of times exceeds the predetermined number of times, use of the foregoing memory cell is inhibited. As an alternative to this, write and erase of data to and from the foregoing memory cell may be inhibited.

The NAND EEPROM has a structure such that, for example, 16 pages form one block. The number of write-verify read cycles may be detected in each page to, for each page, determine the level at which the memory cell is operated.

The level at which the memory cell is operated may be determined for each block or each chip. That is, when the number of performed write-verify read cycles has exceeded a predetermined number of times on one or more page of the sixteen pages forming a certain block, the memory cells in the block including the foregoing page may be operated as, for example, 2-level cells in the following writing operation. If the number of write-verify read cycles has exceeded a predetermined number of times with respect to one or more pages of the plural pages forming the chip, all of the memory cells of the chip including the page may be operated as, for example, 2-level cells in the following writing operation.

The level at which the memory cell is operated may be determined for memory cell block unit formed by dividing the pages. If the operation can be controlled, memory cells having different operation modes may exist on the same page. That is, the unit for changing the number of information items to be stored in the memory cell is not limited particularly. A variety of modifications are permitted as well as the foregoing page units, block units and chip units.

As an alternative to detecting the number of write-verify read cycles, the number of erase-verify read cycles may be detected to change the number of information values to be stored in the memory cell.

The number of write-verify read cycles or the number of erase-verify read cycles may be stored in a counter circuit or may be counted, and information of the counter circuit may be output to the chip.

FIG. 35 is a flow chart showing the operation of a third memory system according to the fifth embodiment.

As shown in FIG. 35, the number of write-verify read cycles (or the number of the erase-verify read cycles) may be detected to change the writing (or erasing) voltage in accordance with the detected result. Specifically in a case of, for example, a 2-level data memory cell, the initial writing voltage is 16V when the number of the performed cycles reaches four. Since writing or erasing cannot easily be performed as the number of write-erase sequence increases, the number of cycles increases. If the number of the cycles exceeds four, the initial writing voltage is made to be 17V. If the number of times of write-erase sequence is further enlarged and thus the number of cycles exceeds four even if the initial writing voltage is 17V, the initial writing voltage is required to be raised to 18V.

If the number of performed cycles exceeds a predetermined number of times, the initial erasing voltage may be raised, as well as raising the writing voltage. As a matter of course, the number of the erase-verify read cycles may be detected to change the erasing voltage or the writing voltage.

Here, a case where the memory cell is used as a 3-level data memory cell after having been performed the predetermined number of times of the write-erase sequence in a 4-level data memory cell mode, is considered. The data write characteristic of the memory cell is deteriorated as the write-erase sequence is repeatedly performed. When a predetermined number of times of write-erase sequence has been performed in the 4-level data memory cell mode, the data write characteristic is decreased accordingly. Thus, when the memory cell is used as the 3-level data memory cell, it is preferable to increase the data write characteristic of the memory cell. As an example of a method of improving the data write characteristic, the data write voltage is increased to enhance the data write characteristic. Specifically, as shown in FIG. 36, an initial value of a write voltage used when the memory cell is operated as the 4-level data memory cell, i.e., a voltage Vp11 of a write pulse P11, is increased to a voltage Vp12 (>Vp11) of a write pulse P12, and for the write pulses in the following write-verify read cycles, the voltage difference (Vp12−VP11) of the initial value in voltage is superposed. As a result, the decrease of the data write characteristic is compensated for and a sufficient write of data is attained for the memory cell so that the memory cell can be used as a 3-level data memory cell. Alternatively, a time period of the write pulse may be increased to enhance the data write characteristic. As shown in FIG. 37, a pulse width of the write pulse, i.e., a pulse time period of the write pulse, is increased from the initial value. That is, a pulse width of the write pulse used when the memory cell is operated as the 4-level data memory cell, i.e., a pulse width Wp21 of a write pulse P21, is increased to a pulse width Wp22 (>Wp21) of a write pulse P12, and furthermore pulse widths of the following write pulses are similarly increased, in comparison with a case of the 4-level data memory cell. As a result, the decrease of the data write characteristic is compensated for and a sufficient write of data is attained for the memory cell so that the memory cell can be used as a 3-level data memory cell. A pulse width of the write pulse is increased.

The above mentioned methods of enhancing the data write characteristic can be applied for a case where the memory cell is used as a 2-level data memory cell after having been performed the predetermined number of times of the write-erase sequence in a 3-level data memory cell mode, is considered. That is, to enhance the data write characteristic, the voltages or pulse widths of the write pulses may be increased, so that the decrease of the data write characteristic is compensated for and a sufficient write of data is attained for the memory cell. As a result, the memory cell can be used as a 2-level data memory cell. A pulse width of the write pulse is increased.

In the above description, an example is shown in which the data write characteristic is improved simultaneously when the write-verify read cycles are monitored to change the performance of the memory cell. However, the data write characteristic may be improved even when the performance of the memory cell are not changed. Specifically, the write-verify read cycle is monitored to detect the degree of deterioration of the memory cell, and in accordance therewith, the initial value of the write voltage or the initial value of the write pulse is increased to enhance the data write characteristic.

A reference is made to a case of a 2-level data memory cell, as an example. The data write characteristic of the memory cell is deteriorated as the write-erase sequence is repeatedly performed. That is, the data write becomes insufficient even when the same write time period or the same write voltage is applied. Thus, after the write-erase sequence has been increased, it is necessary to enhance the data write characteristic. In this point of view, the write-verify read cycle is monitored, and if the number of the cycles exceeds six times, for example, the data write ability is enhanced in the following data write. Alternatively, the write-erase sequence is directly monitored to enhance the data write ability after the predetermined number of times of the write-erase sequence. As an example of a method of improving the data write characteristic, the data write voltage is increased from Vp11 to Vp12 as shown in FIG. 36 to enhance the data write characteristic. Specifically, like the case as shown in FIG. 36, an initial value of a voltage of a write pulse is increased from Vp11 to Vp12, and voltages of the write pulses in the following cycles are similarly increased. As a result, the decrease of the data write characteristic is compensated for and a sufficient write of data is attained for the memory cell. Alternatively, a time period of the write pulse may be increased from Wp21 to Wp22 as shown in FIG. 37 to enhance the data write characteristic. To describe, like the case shown in FIG. 38, a pulse width of the write pulse is increased from the initial value Wp21 to Wp22 throughout the write-verify read cycles. As a result, the decrease of the data write characteristic is compensated for and a sufficient write of data is attained for the memory cell. In the third memory system as described, the time period of the write pulse may be increased for the pulse train as shown in FIG. 37 in which the write voltage is increased every write-verify read cycle, so that the data write ability is enhanced. Alternatively, the write voltage may be increased for the pulse train as shown in FIG. 37 in which the pulse width of the write pulse is increased every write-verify read cycle, so that the data write ability is enhanced.

More specifically, when the number of times of performed write-verify read cycle required for attaining a sufficient data write is within a first predetermined number of times, e.g., four times, the data write operation, i.e. data programming, is performed, using the initial value Vpp0 of the write voltage. The initial value Vpp0 of the write voltage is used until the k-th data programming is performed, at which the number of times of the performed write-verify read cycle for obtaining the sufficient data write reaches or exceeds the first predetermined number of times for the first time. When the number of times of performed write-verify read cycle for sufficient data write reaches or exceeds the first predetermined number of times, then the initial value Vpp0 of the write voltage is changed to the initial value Vpp1 (>Vpp0) of the write voltage, and the initial value Vpp1 is used for the data programming from the (k+1)th data programming until an s-th data programming at which the number of times of the performed write-verify read cycle for obtaining the sufficient data write reaches or exceeds a second predetermined number of times, e.g., four times. When the number of times of performed write-verify read cycle for sufficient data write using Vpp1 reaches or exceeds the second predetermined number of times, then the initial value Vpp1 of the write voltage is changed to the initial value Vpp2 (>Vpp1) of the write voltage when the (s+1)th programming is performed. As described above, the first number of times of write-verify read cycle and the second number of times of write-verify read cycle as shown in FIG. 35 may be the same.

In the memory system as described, a 2-level data memory cell is referred to as an example. However, substantially the same is applied to a 4-level data memory cell and a 3-level data memory cell. Furthermore, in the memory system as described, a data write is referred to as an example, however, substantially the same is applied to a data erase.

As described above, the number of write-verify read cycles or the number of erase-verify read cycles is monitored so that the level at which the memory cell is operated is determined, similarly to the operation for monitoring the number of times of write-erase sequence. Moreover, the performance of the memory cell can easily be determined.

The first to fifth embodiments have the structure such that the multi-level data semiconductor storage device is arranged to reduce the number of information items (values) which are stored in one memory cell as the number of times of write-erase sequence increases. For example, a 4-level memory cell is operated as the 4-level memory cell when the number of times of write-erase sequence is smaller than 500,000 times. Then, the memory cell is operated as a 2-level memory cell. As a result, the number of times of write-erase sequence of the memory system can be enlarged as compared with that of the conventional memory system.

In addition to the NAND EEPROM and a NOR flash memory, the present invention may be applied to an AND (K. Kume et al.;IEDM Tech. Dig., December 1992, pp. 991–993), a DINOR (S. Kobayashi et al.; ISSCC Tech. Dig., 1995, pp. 122) and a virtual ground array (R. Cema et al.; ISSCC tech. Dig., 1995, pp. 126).

As a matter of course, the present invention may be applied to a multi-level data DRAM or a multi-level data mask ROM or a multi-level data SRAM.

The present invention may, of course, be applied to a 5-level memory cell, an 8-level memory cell or a 16-level memory cell as well as the 3-level memory cell or the 4-level memory cell.

As described above, according to the present invention, there is provided a memory system including a multi-level data storing memory cells and exhibiting satisfactory durability against write-erase sequence operation and a memory system including a new system element required for the memory system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A memory system comprising a memory portion including a memory cell for storing n-level data (n is an integer equal to or larger than 3), wherein said memory cell is operated as an n-level data storing memory cell until the number of times a write-erase sequence has been performed reaches a predetermined number of times, and said memory cell is operated as an m-level data storing memory cell (m is an integer smaller than n) when the number of times the write-erase sequence has been performed has exceeded the predetermined number of times.

2. A memory system comprising a memory portion including a memory cell for storing n-level data (n is an integer equal to or larger than 3), wherein said memory cell is operated as an n-level data storing memory cell until the number of times a write-erase sequence has been performed reaches an n-th number of times, said memory cell is operated as an (n−1) level data storing memory cell after the write-erase sequence has been performed the n-th number of times and until the number of times the write-erase sequence has been performed reaches an (n−1)th number of times, and said memory cell is operated as an i-level data storing memory cell (i is an integer equal to or larger than 2) after the write-erase sequence has been performed an (i+1)th number of times and until the number of times the write-erase sequence has been performed reaches an i-th number of times.

3. A memory system comprising a memory portion including a memory cell for storing n-level data (n is an integer equal to or larger than 3), said memory system further comprising a level holding portion for storing information of the level of data stored in said memory cell.

4. A memory system comprising a memory portion including memory cells comprising a first memory cell operating as an n-level data storing memory cell (n is an integer greater than or equal to 3); and a second memory cell operating as an m-level data storing memory cell (m is an integer smaller than n), wherein said second memory cell operated as an n-level data storing memory cell until the number of times data was written to or erased from said second memory cell exceeded a predetermined number.

5. A memory system comprising a memory portion including a memory cell for storing p-level data (p is an integer larger than 2), wherein cycles are repeated, each cycle including a data writing or erasing operation into or from said memory cell and a verify read operation for detecting a state of said memory cell;

the number of the repeated cycles of said writing operation or the erasing operation and the verify read operation is monitored;

a data write voltage to said memory cell in a data write mode or an erase voltage to said memory cell in a data erase mode is increased after the number of the repeated cycles which are performed until data has been successfully written into or erased from said memory cell has reached a predetermined number of times; and said memory cell is operated as an i-level data storing memory cell (i is an integer smaller than p) when the number of times the data writing operation or the data erasing operation has been performed exceeds a predetermined number of times.

6. A memory system according to claim 5, wherein an initial value of the data write voltage in the repeated cycles to said memory cell in the data write mode or an initial value of the erase voltage in the repeated cycles to said memory cell in the data erase mode is increased after the number of the repeated cycles which are performed until data has been successfully written into or erased from said memory cell has reached the predetermined number of times.

7. A memory system comprising a memory portion including a memory cell for storing n-level data (n is an integer equal to or greater than 3), wherein said memory cell is operated as an n-level data storing memory cell until the number of times a writing/erasing operation has been performed reaches a predetermined number, and said memory cell is operated as an m-level data storing memory cell (m is an integer smaller than n) when the number of times the writing/erasing operation has been performed exceeds the predetermined number of times.

8. A memory system according to claim 7, wherein said memory cell is operated as a 2-level data storing memory cell when the number of times the writing/erasing operation has been performed exceeds the predetermined number of times.

9. A memory system according to claim 8, wherein cycles are repeated each of which includes a data writing or erasing operation into or from said memory cell and a verify read operation for detecting a state of said memory cell;

the number of the repeated cycles of the data writing or erasing operation and the verify read operation is monitored; and a change of the n-level memory mode to the 2-level data memory mode is performed after the number of the repeated cycles has reached a predetermined number of times.

10. A memory system according to claim 7, wherein a change of an n-level data memory mode to an m-level data memory mode is performed in a memory chip unit including said memory portion.

11. A memory system according to claim 7, wherein said memory portion includes a memory cell block including a predetermined number of memory cells, said memory cell block serving as a unit for collectively writing or erasing data, and a change of an n-level data memory mode to an m-level data memory mode is performed in the memory cell block unit.

12. A memory system according to claim 7, wherein data is neither written into said memory cell nor erased from said memory cell after the number of times the writing/erasing operation has been performed reaches a certain number in an m-level data memory mode after a change of an n-level data memory mode to the m-level data memory mode has been performed.

13. A memory system according to claim 7, wherein said memory cell is not used after the number of times the writing/erasing operation has been performed reaches a certain number in an m-level data memory mode after change of an n-level data memory mode to the m-level data memory mode has been performed.

14. A memory system according to claim 7, wherein
cycles are repeated, each cycle including a data writing or erasing operation into or from said memory cell and a verify read operation for detecting a state of said memory cell;
the number of the repeated cycles of the data writing or erasing operation and the verify read operation is monitored; and
a change of an n-level data memory mode to an m-level data memory mode is performed after the number of the repeated cycles has reached a predetermined number.

15. A memory system according to claim 7, wherein a data write voltage to said memory cell in a data write mode or an erase voltage to said memory cell in a data erase mode is increased when said memory cell is operated as the m-level data storing memory cell after the number of times the write/erase operation has been performed has exceeded the predetermined number of times.

16. A memory system according to claim 7, wherein a width of a data write pulse to said memory cell in a data write mode or a width of a data erase pulse to said memory cell in a data erase mode is increased when said memory cell is operated as the m-level data storing memory cell after the number of times the write/erase operation has been performed has exceeded the predetermined number of times.

17. A memory system comprising a memory portion including a memory cell for storing n-level data (n is an integer equal to or larger than 3), wherein
said memory cell is operated as an n-level data storing memory cell until the number of times a writing/erasing operation has been performed reaches an n-th number of times, said memory cell is operated as an (n−1) level data storing memory cell after the writing/erasing operation has been performed the n-th number of times and until the number of times the writing/erasing operation has been performed reaches an (n−1)th number of times, and said memory cell is operated as an i-level data storing memory cell (i is an integer equal to or greater than 2) after the writing/erasing operation has been performed an (i+1)th number of times and until the number of times the writing/erasing operation has been performed reaches an i-th number of times.

18. A memory system according to claim 17, wherein a change of an n-level data memory mode to an (n−1) level data memory mode or a change of an (i+1) level data memory mode to an i-level data memory mode is performed in a memory chip unit including said memory portion.

19. A memory system according to claim 17, wherein said memory portion includes a memory cell block including a predetermined number of memory cells, said memory cell block serving as a unit for collectively writing or erasing data, and a change of an n-level data memory mode to an (n−1) level data memory mode or a change of an (i+1) level data memory mode to an i-level data memory mode is performed in the memory cell block unit.

20. A memory system according to claim 17, wherein data is neither written into said memory cell nor erased from said memory cell after the number of times the writing/erasing operation has been performed reaches a certain number in an (n−1) level data memory mode after a change of an n-level data memory mode to the (n−1) level data memory mode has been performed or after the number of times the writing/erasing operation has been performed reaches a certain number in an i-level data memory mode after a change of an (i+1) level data memory mode to the i-level data memory mode has been performed.

21. A memory system according to claim 17, wherein said memory cell is not used after the number of times the writing/erasing operation has been performed reaches a certain number in an (n−1) level data memory mode after change of an n-level data memory mode to the (n−1) level data memory mode has been performed or after the number of times the writing/erasing operation has been performed reaches a certain number in an i-level data memory mode after change of an (i+1) level data memory mode to the i-level data memory mode has been performed.

22. A memory system according to claim 17, wherein
cycles are repeated, each cycle including a data writing or erasing operation into or from said memory cell and a verify read operation for detecting a state of said memory cell;
the number of the repeated cycles of the data writing or erasing operation and the verify read operation is monitored; and
a change of an n-level data memory mode to an (n−1) level data memory mode or a change of an (i+1) level data memory mode to an i-level data memory mode is performed after the number of the repeated cycles has reached a predetermined number.

23. A memory system according to claim 17, wherein a data writing voltage to said memory cell in a data write mode or a data erase voltage in a data erase mode is increased when said memory cell is operated as the (n−1) level data storing memory cell after the number of times the write/erase operation has been performed has exceeded the n-th number of times or when said memory cell is operated as the i-level data storing memory cell after the number of times the write/erase operation has been performed has exceeded the (i+1)th number of times.

24. A memory system according to claim 17, wherein a width of a data write pulse to said memory cell in a data write mode or a width of a data erase pulse to said memory cell in a data erase mode is increased when said memory cell is operated as the (n−1) level data storing memory cell after the number of times the write/erase operation has been performed has exceeded the n-th number of times or when said memory cell is operated as the i-level data string memory cell after the number of times the write/erase operation has been performed has exceeded the (i+1)th number of times.

25. A memory system comprising memory cells, each memory cell capable of storing any one of "n" threshold levels, the threshold levels designating respective states corresponding to the storage of "n"-level data, wherein "n" is an integer equal to or larger than 3 and "n" is decreased for said memory cells when the number of times data is written to or erased from said memory cells exceeds a predetermined number.

* * * * *

UNITED STATES PATENT AND TRADEMARK OFFICE
CERTIFICATE OF CORRECTION

PATENT NO. : 5,844,841
DATED : December 1, 1998
INVENTOR(S) : Ken TAKEUCHI et al.

It is certified that error appears in the above-identified patent and that said Letters Patent is hereby corrected as shown below:

Column 36, line 58, claim 9, after the word "repeated" insert a comma (--,--) and delete "of which includes" and insert --cycle including--.

Column 36, line 64, claim 9, delete "the" (first occurrence) and insert --an-- and delete "the" (second occurrence) and insert --a--.

Column 36, lines 66 and 67, claim 9, delete "of times".

Signed and Sealed this

Fifteenth Day of June, 1999

Attest:

Q. TODD DICKINSON

Attesting Officer        Acting Commissioner of Patents and Trademarks